(12) United States Patent
Kamijima et al.

(10) Patent No.: US 6,757,455 B1
(45) Date of Patent: Jun. 29, 2004

(54) MICROMACHINE AND MANUFACTURING METHOD THEREFOR

(75) Inventors: Shunji Kamijima, Haramura (JP); Masatoshi Yonekubo, Haramura (JP); Takashi Takeda, Suwa (JP); Takao Nishikawa, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/581,313
(22) PCT Filed: Oct. 13, 1999
(86) PCT No.: PCT/JP99/05655
§ 371 (c)(1),
(2), (4) Date: Jun. 12, 2000
(87) PCT Pub. No.: WO00/21877
PCT Pub. Date: Apr. 20, 2000

(30) Foreign Application Priority Data

Oct. 13, 1998 (JP) ............................. 10-291218
Mar. 12, 1999 (JP) ............................. 11-067166

(51) Int. Cl.[7] ............................................. G02B 6/26
(52) U.S. Cl. ............................. 385/16; 385/18; 385/19
(58) Field of Search ............................. 385/16, 17, 18, 385/19, 1.2; 26/2.5, 1.25; 502/527.24; 216/24

(56) References Cited

U.S. PATENT DOCUMENTS

| 3,544,201 | A |   | 12/1970 | Fowier et al. |
| 5,262,000 | A | * | 11/1993 | Welbourn et al. ........... 156/643 |
| 5,771,321 | A | * | 6/1998 | Stern ............................. 385/31 |
| 5,774,257 | A | * | 6/1998 | Shibata et al. ............... 359/291 |
| 5,953,469 | A | * | 9/1999 | Zhou ............................ 385/22 |
| 6,017,973 | A | * | 1/2000 | Tamura et al. ................ 522/96 |
| 6,057,636 | A | * | 5/2000 | Sakai et al. .................. 313/306 |
| 6,160,230 | A | * | 12/2000 | McMillan et al. ............ 385/16 |
| 6,212,314 | B1 | * | 4/2001 | Ford ........................... 385/30 |
| 6,218,203 | B1 | * | 4/2001 | Khoury et al. ................ 438/15 |
| 6,323,833 | B1 | * | 11/2001 | Takeuchi et al. .............. 385/32 |

FOREIGN PATENT DOCUMENTS

| JP | A-7-159708 | 6/1995 |
| JP | A-7-225303 | 8/1995 |

* cited by examiner

*Primary Examiner*—Rodney Bovernick
*Assistant Examiner*—Juliana Kang
(74) *Attorney, Agent, or Firm*—Oliff & Berridge, PLC

(57) ABSTRACT

A micromachine and a manufacturing method are provided for a micromachine that has a dynamic first microstructured portion serving as a drive portion, and a static second microstructured portion adapted to perform a switching function and which functions as an optical element. The second microstructured portion can be manufactured at least without complex steps, such as a silicon process, by forming a static second microstructure on the dynamic first microstructured portion, or in such a way as to be overlaid thereon by mold transfer. Thus, the microstructured portion of a complex shape can be easily formed with good reproducibility. When a plurality of elements are arranged in an array, similarly as in the case of a spatial light modulator, the stable reproduction thereof is achieved by the mold transfer. Thus, as compared with the case of manufacturing all elements in a silicon process, the probability of an occurrence of a defect is very low.

27 Claims, 10 Drawing Sheets

(a)

(b)

(a)

(b)

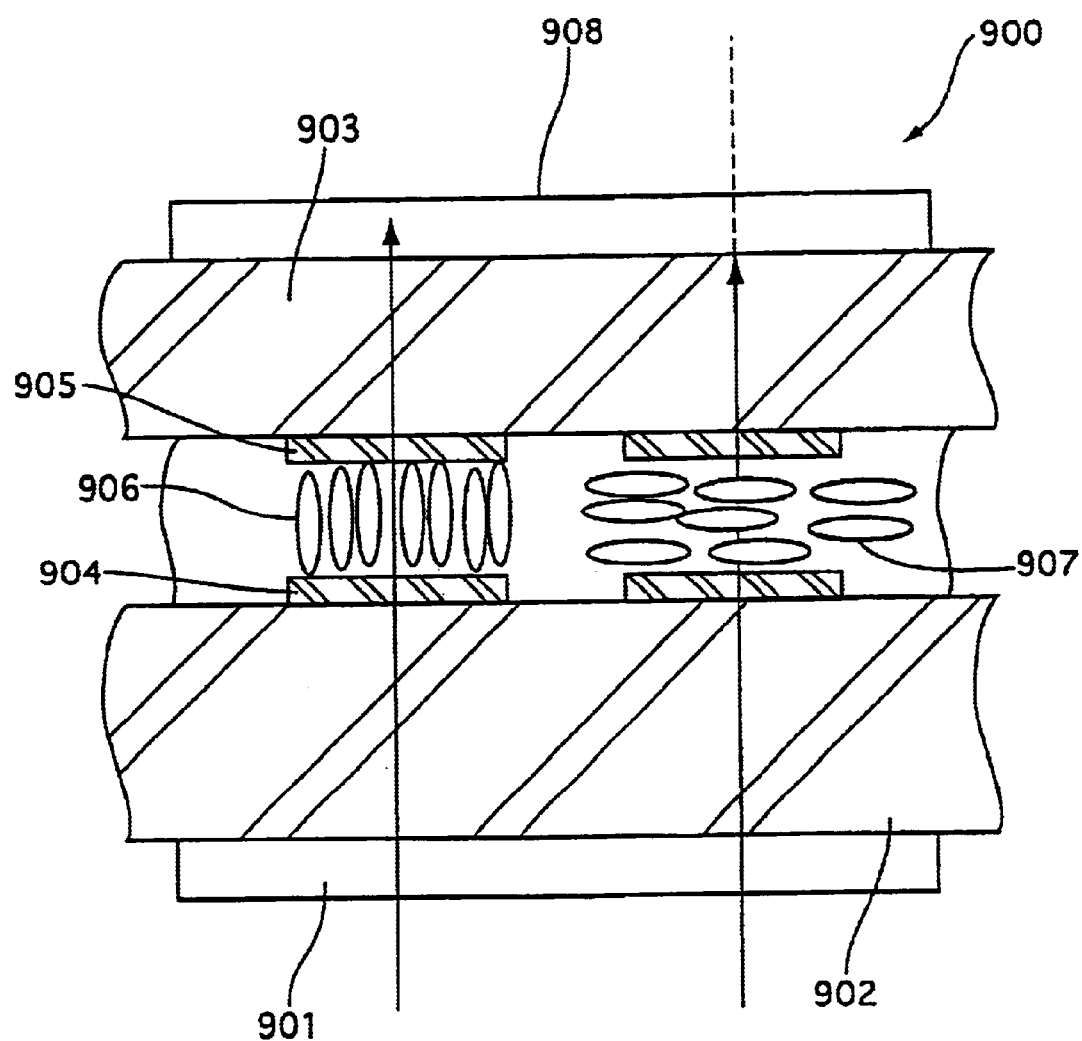

MICROMACHINE AND MANUFACTURING METHOD THEREFOR

BACKGROUND OF THE INVENTION

1. Field of the Invention

The present invention relates to a micromachine, such as an optical switching element for use in an image display device, and to a manufacturing method therefor.

2. Description of Related Art

An optical switching element using liquid crystals has been known as that enabled to control the switching-on and switching-off of light. FIG. 13 schematically shows the configuration thereof. This optical switching element 900 may consist of polarizing plates 901 and 908, glass plates 902 and 903, transparent electrodes 904 and 905, and liquid crystals 906 and 907. The direction of alignment of liquid crystal molecules is changed by controlling a voltage applied between the transparent electrodes 904 and 905. Thus, the plane of polarization thereof is turned thereby to perform optical switching. Consequently, an image display device can be constituted as a liquid crystal panel by arranging such optical switching elements (namely, liquid crystal cells) in a two-dimensional form.

However, this optical switching element using liquid crystals is poor in high-speed response, and operates at a response speed of as low as about several millimeters per second. It is, therefore, difficult to use a spatial light modulator, which employs liquid crystals, in optical communication, optical computing, an optical storage device such as a hologram memory, and an optical printer, which require a high response speed. Further, the spatial light modulator employing liquid crystals has a drawback in that efficiency in using light is degraded by the polarizing plates.

This enables higher-speed switching. Thus, optical switching elements, whose efficiency in using light is high, are demanded. One such optical switching element is a spatial light modulator enabled to achieve high-speed modulation by mechanically moving an optical element that can control light. An example of the spatial light modulator made to be highly practical is a micromirror device. This device is adapted so that a mirror serving as an optical element is turnably supported by a yoke, and that incident light is modulated by changing the angle of the mirror, and then outputted therefrom.

Alternatively, incident light can be modulated by moving the position of a planar optical element having a reflection function or a transmission function. Thus, a spatial light modulator adapted to mechanically move such an optical element may be employed. Applicant of the present application assiduously develops one such spatial light modulator adapted to extract evanescent light from a total reflection surface of a light guiding portion, which can transmit light by performing total reflection thereof, by bringing a switching portion, which has an extraction surface adapted to transmit light, (in an on-state) into contact with the total reflection surface. This switching portion is turned off by being detached from the total reflection surface by a minute distance of about one wavelength or less. This spatial light modulator can switch on and off light by moving the switching portion, which functions as an optical element, by a minute distance. Thus, this spatial light modulator is an optical switching element that can modulate and control light at a high speed. Electrostatic force generated by applying a voltage to the electrodes is mainly used as means for driving the switching portion.

In the case of using this spatial light modulator, it is necessary to move the switching portion with good accuracy by a distance on the order of the wavelength, for example, about one-tenth of several microns, namely, a distance of submicron order. Therefore, to manufacture the switching portion and a drive portion, a manufacturing method, by which such portions are manufactured with a sufficient precision of one micron, is demanded. Especially, the switching portion is an optical element, so that accuracy, which is commensurate with or less than the movement distance of submicron order, is demanded as the surface finish accuracy thereof. Furthermore, when a two-dimensional image is actually generated by the spatial light modulator, it is necessary to arrange a plurality of switching elements in an array. Thus, there is the necessity for manufacturing a large number of switching elements of the same constitution with precision of one micron or less in such a way so as to adjoin one another.

SUMMARY OF THE INVENTION

Techniques of manufacturing such elements with precision of one micron have currently been being developed. Such techniques are, for instance, photolithography techniques having progressed as techniques for manufacturing semiconductors. According to present design rules, necessary precision is about one-tenth of several microns. When the design rules are met, the precision needed for manufacturing the aforementioned spatial light modulator can be obtained. In addition, there has been developed a manufacturing method of manufacturing a structure with precision of one micron by utilizing manufacturing techniques, such as an oxide film formation technique, a crystal growth technique, a CMP planarization technique, a laser processing technique, a sol-gel forming technique, a sintering technique, and a machine cutting technique. Thus, a machine, which is called a micromachine and has structure of the size represented in units of microns, is manufactured by these techniques.

However, the tolerance of products produced by these manufacturing methods is one-tenth of several microns. Thus, although a structure constituted by a micromachine is produced by these manufacturing methods, the necessary surface accuracy of a microstructure, which is less than the tolerance thereof, cannot be necessarily ensured. Moreover, it is difficult to assure the positional relationship among a plurality of switching elements with precision of one-tenth of several microns or less. Furthermore, the photolithography techniques are the most advanced techniques of processing microstructures, and those for processing silicon employed as a material. Thus, even in the case of using the photolithography techniques, it is difficult to process other materials, for example, a transmissive resin material suitable for an optical element.

Similar problems occur in other micromachines, such as an optical micro-switch for switching on and off signals transmitted between optical fibers, and a microvalve for allowing fluids to flow therethrough and shutting off the fluids. Thus, it becomes necessary to develop a micromachine, which can ensure the surface accuracy of microstructures and establish the positional relationship between adjoining ones thereof and provide a gap or a step therebetween with high accuracy, and a manufacturing method therefor.

Accordingly, an object of the present invention is to provide a micromachine, which can highly accurately manufacture a machine, whose size is in the order of a micron or less, for driving a microstructure, such as a switching portion, and a manufacturing method therefor. Particularly, an object of the present invention is to provide a micromachine suitable for a spatial light modulator having a device operative to modulate light by moving and controlling a microswitch portion, such as the optical switching portion utilizing evanescent light, which has a planar component, that is, a micromachine in which a high-accuracy surface is formed and in which a drive system for microstructures, and to provide a manufacturing method therefor.

Further, another object of the present invention is to provide a configuration, by which a micromachine having a drive system can be manufactured, and to provide a manufacturing method therefor.

Moreover, another object of the present invention is to realize a structure of a micromachine efficiently providing a configuration, in which a plurality of units each having a high-accuracy surface of a microstructure and a drive system for the microstructure are arranged in a array, with high precision, and to provide a manufacturing method therefor.

Therefore, according to the present invention, the techniques of a mold transfer method employed as a method for manufacturing microlenses or microprisms are used for manufacturing a micromachine having a drive system. However, in the case of using the mold transfer method, the surface accuracy of the microstructure can be ensured, while the drive system itself including a spring or a film cannot be manufactured in the micromachine. Thus, according to the present invention, a micromachine, in which a first microstructured portion drives a second microstructured portion of a predetermined shape, is manufactured by using a molding step, at which the second microstructured portion is manufactured by being put on the first microstructured portion and by forming at least a part thereof by the mold transfer method after the first microstructured portion serving as a driver system is manufactured. This manufacturing method can provide a micromachine that has a second microstructured portion, at least a part of which is formed by the mold transfer, and a first microstructured portion for driving this second microstructured portion.

According to the micromachine of the present invention and the manufacturing method therefor, a second microstructured portion, which is required to have surface accuracy in addition to a microstructure, can be efficiently manufactured with high precision by employing the mold transfer suitable for the second microstructure, instead of manufacturing the entire micromachine by one of the techniques. Moreover, as long as the mold transfer is employed, there is a little limit to the material. Thus, a transmissive microstructure, which is required by the spatial light modulator, can be easily formed in the micromachine. On the other hand, the first microstructured portion realizing a drive system, which can be constituted by a complex combination of a spring, a film, and a post, is formed on a silicon substrate by performing processes such as a silicon process which consists of a photolithography step and one of or a combination of a dry etching step, a wet etching step, an oxide film forming step, a crystal growth step, and a CMP planarization step, a laser processing process, a sol-gel forming process, a sintering process, and a machine cutting process. The first microstructured portion includes a structure caused by external power to work, an actuator caused by external energy to work, and a sensor type actuator varying in response to a change in ambient environment.

The microstructured portion, which is caused by external power to work, includes a gear, a hinge, and a plate spring.

Further, the actuator, which is caused by external energy to work, includes an electrostatic actuator formed by the photolithography techniques employed in the silicon process, a piezoactuator formed by the sol-gel method, a piezo thin film actuator formed by a sputter method, a laminated piezoactuator, a heating actuator adapted to heat a sealed fluid by using a heater and to utilize a force generated owing to thermal expansion of the fluid, and a shape memory alloy actuator that comes to have an actuator function by setting a combination of shape memory alloys and individually heating the shape memory alloys. Furthermore, the element caused by a change in the ambient environment to work includes a bimetal actuator that is formed by putting metals, whose expansion coefficients differ from each other, together and deforms owing to thermal expansion of the metals caused in response to a change in ambient temperature.

The microstructures can be reproduced with good accuracy by forming the second microstructured portion by the mold transfer. Particularly, the flatness of the surface thereof can be ensured. Moreover, the positional relationship between adjacent members can be easily controlled with extremely high precision. Therefore, the second microstructured portion is suitably for the switching-on and switching-off of light and a fluid, namely, for realizing the switching function. Furthermore, according to the manufacturing method of the present invention, the flatness of the surface can be ensured with extremely high precision. Thus, the manufacturing method of the present invention is suitable for imparting the optical element function to the second microstructured portion. Therefore, a micromachine manufactured by the manufacturing method of the present invention is suitable for realizing a spatial light modulator of the size represented in the order of microns, in which light is modulated by the second microstructured portion.

Further, the microstructure can be reproduced with good precision by forming the second microstructured portion by the mold transfer. Moreover, the positional relationship between the members can be determined with extremely high accuracy. Thus, the manufacturing method of the present invention is suitable for manufacturing a micromachine by manufacturing a plurality of second microstructured portions by using the same mold so that the plurality of second microstructured portions are arranged in a two-dimensional array. Furthermore, in the case of a micromachine having a third microstructured portion, such as a post, which is not driven by the first microstructured portion, the positional relationship among these microstructured portions can be easily controlled with very high accuracy by performing the transfer of the second and third microstructured portions by using the same mold. Thus, in the case of a micromachine of the size in the order of sub-microns, which requires the step formed between the second and third microstructured portions and the gap formed therebetween, the dimensions of the step and gap can be stably reproduced with extremely high precision.

Although the entire second microstructured portion can be formed by the mold transfer, the effects of the present invention can be obtained by forming at least a part, which requires the surface accuracy and the positional accuracy thereof by the mold transfer. It is the same with the case of performing the transfer of a plurality of second microstructured portions or the second and third microstructured portions by using the same mold. Further, the mold to be transferred can be used a plurality of times. Thus, as compared with the case of producing micromachines, such as a spatial light modulator, by the machine cutting or the silicon process, the micromachines of the complex shapes can be easily produced. In addition, the production cost thereof can be considerably reduced.

As the first microstructured portion serving as the drive system, an electrostatic actuator, which can be controlled by electric power, is specially useful as, for instance, a spatial light demodulator. Therefore, the photolithography techniques employed in the silicon process, by which minute films and electrodes can be easily produced in the micromachine, is very effective as a method for manufacturing the first microstructured portion. On the other hand, there is the possibility that the first microstructured portion produced in the micromachine by performing this process is broken by stress generated when the second microstructure is formed on the first microstructure by the mold transfer. Therefore, it is preferable that first, the second microstructured portion is molded without etching a sacrifice layer provided in the periphery of the first microstructured portion, and subsequently, the etching of the sacrifice layer is performed. Furthermore, even in the case that the first microstructured portion is not formed by using the photolithography techniques, a sacrifice layer is formed around the first microstructured portion by applying resin therearound so as to prevent the first microstructure from being broken. Alternatively, it is preferable that a sacrifice layer made of $SiO_2$ and aluminum by, for example, a plasma CVD method.

When the second microstructured portion is manufactured by the mold transfer, stress applied to the first microstructure can be reduced by fixing the first microstructured portion, which serves as a moving part, by using the sacrifice layer in this way. Simultaneously, the accuracy of the positioning of the first and second microstructured portions is improved by planarization of the first microstructured portion and the sacrifice layer provided therearound. Furthermore, mechanical polishing and mechanical-chemical polishing techniques are effective for the planarization at that time.

Further, when the second microstructure is formed by the mold transfer, a large amount of resin is used on the connecting surface between the first and second microstructured portions, namely, the boundary surface of the first microstructured portion. Thus, it is preferable for enhancing the connectivity therebetween that no metallic film is formed on such a surface. In the case that the first microstructured portion has a metallic film in the range in which the second microstructured portion is transferred, it is preferable that a non-metallic film made of, for example, silicon is provided in the range thereof. When the conjunction between the metallic layer constituting the first microstructured portion and the second microstructured portion is needed, it is necessary for enhancing the adhesion therebetween to rough the surface or to realize a wedge-shaped contact surface.

Methods for forming the mold, which is used at the time of forming the second microstructured portion by the mold transfer, include a method of forming the mold by precision machining, a method of forming the mold on a silicon substrate by the photolithography techniques, a method of molding (namely, performing the optical molding of) the mold by directly exposing a resist, a method of forming the mold by laser processing, and a method of forming and shaping the mold by electric discharge machining. Further, a mold capable of transmitting light can be formed by using a material adapted to transmit light instead of performing a plurality of steps.

First, a mold, by which a microstructure is formed with good accuracy, can be made by performing a combination of anisotropic etching and isotropic etching. For instance, etching is performed on a silicon substrate in KOH solution by adjusting an orientation plane of crystals and a mask to the (1,1,0) plane. Thus, the anisotropic etching progresses, so that an inverse triangle hole, whose vertex angle is 109.48 degrees, is formed therein. When the depth of this inverse triangle reaches a predetermined depth, the isotropic etching is performed by using $SF_6$, which is a fluoride gas, so that a structure extending in a vertical direction is formed. Consequently, the mold for forming the second microstructured portion is formed. Moreover, a mold for simultaneously forming the third microstructured portion can be obtained.

Furthermore, it is effective to perform the mold transfer by applying a photosetting resin, such as an ultraviolet-set resin, onto the first microstructured portion, and using a transmissive mold. Further, the positioning of the microstructured portion can be performed according to the optical information processing by utilizing an alignment mark provided on the base of the first microstructured portion, and an alignment mark provided on the mold for forming the second microstructure. The positional relationship between the first and second microstructured portions can be limited with good accuracy. To adjust the relationship in position in the direction of height between the first and second microstructured portions, bubbles are efficiently removed from the resin or the portion between the resin and the mold by applying a photosetting resin on the first microstructured portion, and then bringing this portion, on which the mold is put, into a chamber, and subsequently, setting the ambient pressure of the photosetting resin, which is to be molded, at a value which is lower than the atmospheric pressure, before the resin is photo-cured, or evacuating the chamber in such a way as to produce a vacuum therein. Further, because of the use of the transmissive mold, the photosetting resin is cured by irradiating the photosetting resin with light (namely, ultraviolet) in such a state. Consequently, the second microstructured portion can be manufactured with high precision in high yield.

The transmissive mold can be manufactured by machining a glass material or a plastic member, which transmits light. When portions of more minute shapes are manufactured with high accuracy, a primary mold for forming the second structure portion is formed on an opaque silicon base by etching. Then, a secondary mold is produced by transferring the primary mold onto a transparent resin. Further, the photosetting resin can be irradiated with light radiated from the outside by the mold transfer using this transmissive secondary mold. As described above, it is desirable that the structure for limiting the positional relationship between the first and second microstructured portions is provided in the secondary mold.

Ultraviolet-set resin may be used as a material transmitting light and constituting the secondary mold. (Although a thermosetting resin, an epoxy dry resin, a polycarbonate resin, a polyimide resin, and an ultraviolet-set resin can be used as the resin, a manufacturing method using an ultraviolet-set resin is described herein by way of example. Examples of the ultraviolet-set resin are radical polymerization resins, such as an unsaturated polyester resin, an acryl type or polyester acrylate resin, a polyester acrylate resin, a urethane acrylate resin, an epoxy acrylate resin, polyether acrylate resin, an acrylate resin of the type including an acryloyl group on the side chain thereof, a thiol-ene type polythiol acrylated drivative, and a polythiol spiroacetal resin, and cationic polymerization resins, such as an epoxy type or epoxy resin. These resins may be used.) Further, the secondary mold can be formed by applying an ultraviolet-set resin on the surface of a silicon substrate formed in such a way as to have a shape corresponding to the second microstructured portion by etching or corresponding to the second and third microstructured portions in the case of simultaneously transferring these microstructured portions. More preferably, putting a transparent plate material made of polycarbonate, glass, or polyimide on the ultraviolet-set resin at that time and then ultraviolet-curing the transparent plate material. Thus, the patterns of the silicon primary mold and the transmissive second mold can be easily produced.

In the case that the second microstructure is formed by the mold transfer, the predetermined shape and performance thereof can be obtained by performing the mold transfer once. However, a constituent part having high surface accuracy can be provided in the second microstructured portion by performing the mold transfer a plurality of times. For example, after a first part having a V-shaped groove of the second microstructured portion is formed in the first microstructured portion by the mold transfer, a surface of this part is used as a reflection surface. Thus, a metallic film made of gold, silver, or platinum is formed thereon by using means, such as sputtering, deposition, or crystal growth, in such a manner as to have a thickness of several hundreds Å.

Furthermore, an ultraviolet-set resin is applied onto the V-shaped groove of the second microstructured portion and onto a region acting as a post portion that may be used as the third microstructured portion. Then, the planarized transparent member made of glass, polycarbonate, or acrylate is pressed thereagainst as the transfer mold. Consequently, the ultraviolet-set resin is cured by irradiating ultraviolet rays onto the planarized transparent member. Hence, the second microstructured portion having the V-shaped groove and the flat surface serving as the extraction surface can be manufactured. Thus, the second microstructured portion for switching, which has a surface for extracting the evanescent wave, and a reflection surface, can be manufactured. Consequently, a macromachine serving as a spatial light modulator using evanescent waves can be manufactured.

The positional relationship between the post and the switching portion can be determined with good accuracy by providing a predetermined step between the post, which serves as the third microstructured portion, and the switching portion, which serves as the second microstructured portion, in the transfer mold. Moreover, the step therebetween can be controlled with good precision. At that time, bubbles are removed from the resin by setting the ambient pressure at a value, which is lower than the atmospheric pressure, or evacuating so as to cause a vacuum state. Thus, as described above, a more flat microprism is produced. The switching accuracy is enhanced. Consequently, a stable switching operation and high contrast can be obtained.

Further, the second microstructured portion, from which light is extracted, is formed from the resin. Thus, as compared with the case of employing glass material, the hardness is low. Moreover, the flatness of the light extraction surface can be ensured by the mold transfer. This results in an increase in the adherence between the surface (namely, extraction surface) of the second microstructured portion and the surface of the light guiding portion adapted to guide light by performing the total reflection of the light. Thus, the micromachine of the present invention can provide a more stable switching operation and a high contrast spatial light modulator.

Further, the second microstructured portion can be formed by the combination of the mold transfer technique and the photolithography technique. For example, an unnecessary part of the second microstructured portion can be removed by using the photolithographic techniques, such as masking, wet etching, and dry etching. Furthermore, in the case that the second microstructured portion is made of resin, the unnecessary part can be removed by being irradiated with light emitted from an excimer laser. At that time, the sacrifice layer provided for fixing the first microstructured portion can be removed by etching.

BRIEF DESCRIPTION OF THE DRAWINGS

FIG. 13 is a diagram illustrating a conventional optical switching element using liquid crystals.

DETAILED DESCRIPTION OF THE EMBODIMENTS

Spatial Light Modulator

Hereinafter, the present invention will be described in more detail by describing an example of the manufacture of a spatial light modulator.

Outline of Configuration of Spatial Light Modulator

Figure 1:
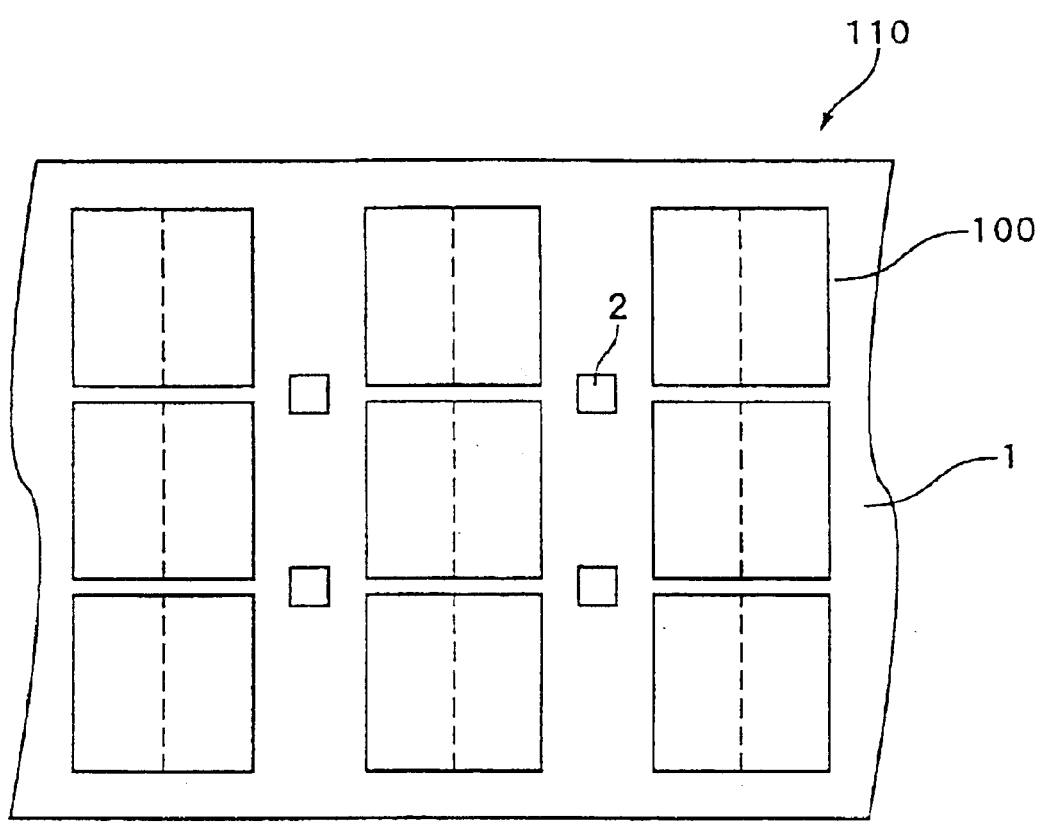
FIG. 1 is a diagram illustrating a plan view of the configuration of a spatial light modulator, which is according to an embodiment of the present invention.
Figure 2:
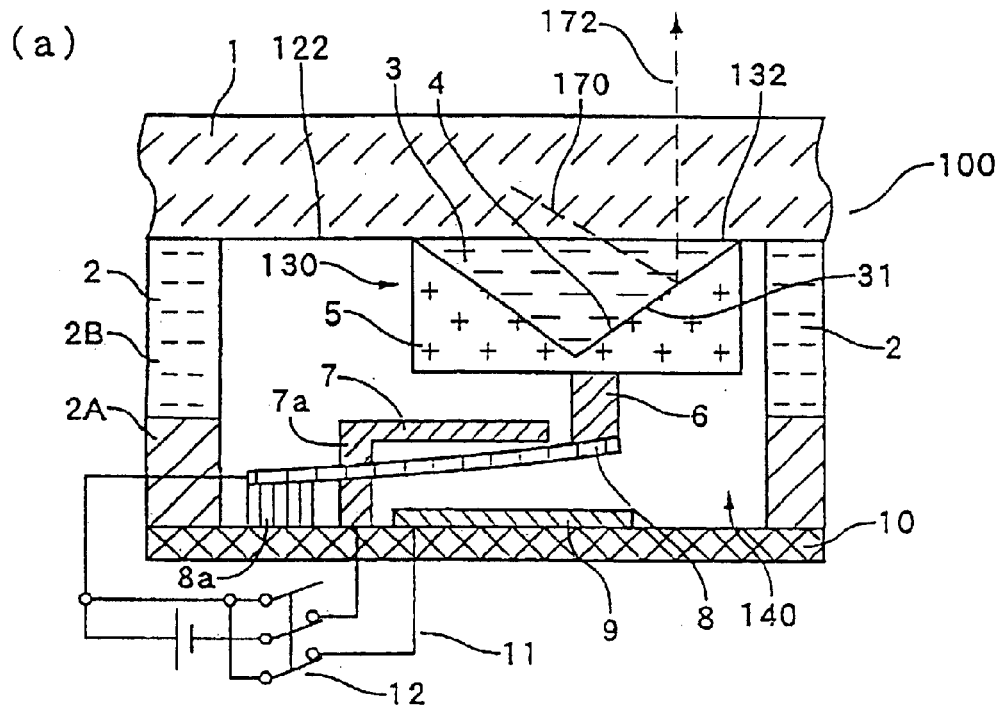
FIGS. 2(a)–(b) are sectional diagrams illustrating the structure of an optical switching element of the spatial light modulator shown in FIG. 1.
Figure 2:
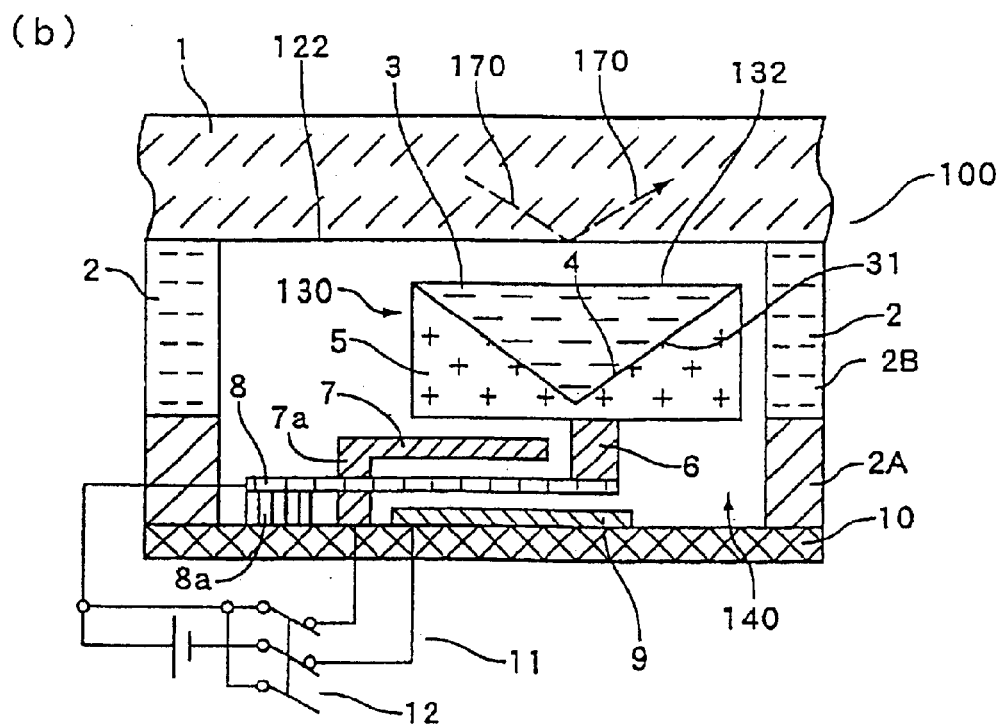

In a spatial light demodulator 110 of this example, a plurality of switching elements 100 are arranged in a two-dimensional array, as illustrated in FIG. 1. In the case that an image is represented by this spatial light modulator 110, each of the switching elements at 100 is a switching device adapted to function as a pixel. FIGS. 2(a)–(b) illustrates an outline of the configuration of the switching element 100 by picking out one of the switching elements 100 and using a sectional representation thereof. The optical switching element 100 of this example is operative to extract evanescent light by bringing a switching portion 130, which has a transmissive extraction surface, into contact with the total reflection surface (namely, the bottom surface) of the light guiding portion 1, which performs the total reflection of incident light 170 and can transmit the light 170 to a plurality of switching elements. Further, in the switching portion 130, the extracted light is reflected to the light guiding portion 1. Then, light 172 is outputted from the light guiding portion 1. This optical switching element 100 can modulate (namely, control the switching-on and switching-off of) incident light 170 at a high speed in response to a micro-movement of the switching portion 130, which is one wavelength or less. Thus, a drive portion 140 using an electrostatic force is provided so as to drive the switching portion 130.

More particularly, a glass material having high transparency for the incident light 170 is used in a light guide (including the light guiding portion and a cover glass) 1. The light guide 1 is supported by a post 2 extending from the same direction as the direction of the switching portion 130 so that the switching (on/off) of light can be performed by a micro-movement (which is one wavelength or less) of the switching portion 130. Thus, an appropriate clearance is formed between the light guide 1 and the switching portion 130. The bottom surface of the light guide 1 is a total reflection surface 122. As illustrated in FIG. 2(b), the incident light 170 is inputted to the light guide 1 so that the incident light 170 undergoes total reflection unless the switching portion 130 is not in contact therewith.

In contrast, when the extraction surface 132 of the switching portion 130 approaches or is brought into intimate contact with the total reflection surface 122 in a direction (namely, a first direction) parallel therewith, and reaches a position (namely, a first position) at which evanescent light can be extracted, as illustrated in FIG. 2(a), the incident light 170 is extracted to the switching portion 130. The switching portion 130 of this example has a microprism 3 enabled to reflect the extracted incident light 170 to the light guiding portion 1, so that the extracted light travels through the light guiding potion 1 and becomes almost perpendicular to the portion 1 and then is outputted therefrom. Furthermore, as illustrated in FIG. 2(b), when the switching portion 130 moves from the first position to a second position, the portion 130 is away from the light guide 1. Thus, when the extraction surface 132 is detached from the total reflection surface 122, the light 170 undergoes total reflection. Consequently, evanescent light is not extracted from the light guiding portion 1. Therefore, the output light 172 is not from the light guiding portion 1.

Thus, in the case of the optical switching element 100 of this example, incident light 170 can be modulated as output light 172 by moving the switching portion 130 to the first and second positions. Therefore, a spatial light modulator for switching can be constituted by the optical switching element singly. Further, for various kinds of purposes, light can be modulated by arranging a plurality of optical switching elements. Furthermore, a spatial light modulator having a function of an image display device, which displays an image by switching on and off output light 172, can be realized by arranging the optical switching elements 100 in an array, as shown in FIG. 1. Hence, the optical switching element or spatial light modulator using the evanescent light can be used for the purpose and objects similar to those of the previously described liquid crystal or micromirror device. Further, the evanescent light can be controlled by moving the switching portion 130 by one wavelength or less. Consequently, there is provided an optical switching element whose operating speed is far higher than that of the liquid crystal.

Thus, the optical switching elements 100 of this example has a structure, wherein the switching portion 130 and the drive portion for driving this switching portion 130 are stacked on the light guiding portion 1 on which the incident light 170 is incident. The switching portion 130 and the drive portion 140 are manufactured according to the micromachine manufacturing method of the present invention. More specifically, the switching portion 130 of this example has the extraction surface 132 for extracting evanescent light, which is formed in such a manner as to face the light guiding portion 1. Further, the switching portion 130 contains a microprism 3 for switching on and off the incident light 170, a reflection film 31 having a surface 4 formed in such a way as to reflect the incident light 170, and a V-shaped groove structure 5 for limiting an angle at which the incident light 170 is reflected to the side of the light guiding portion 1.

Further, a drive portion 140 placed under the switching portion 130 has a support base 6 for connecting the drive portion 140 to the switching portion 130, an address upper electrode (a first electrode) 7 to be used for moving the switching portion 130 to the side of the light guiding portion 1 (namely, to the tipper side), an intermediate electrode (a second electrode) 8 placed under the address upper electrode 7 and connected directly to the switching portion 130 and enabled to move, and an address lower electrode (a third electrode) 9 to be used for moving the switching portion 130 to the side of the silicon substrate 10 placed under the intermediate electrode 8. The address lower electrode 9 is formed on (the surface of) the silicon substrate 10. The address upper electrode 7 is supported by the support base 7a, which extends upwardly from the silicon substrate 10 and is used for supporting the address upper electrode. Furthermore, the intermediate electrode 8 is supported by the support base 8a for supporting the intermediate electrode 8.

This drive portion 140 is formed on the silicon substrate (IC chip) 10, on which a drive circuit (a power supply portion) 11 for controlling the drive portion 140 is constructed. First, in an on-state illustrated in FIG. 2(a), DC current is supplied from the power supply portion 11 to the address upper electrode 7 by switching the power supply switch 12 of the power supply portion 11. Thus, an electrostatic force generated between the address upper electrode 7 and the intermediate electrode 8 upwardly pulls the intermediate electrode 8. As a result, the support base 6, which is a structure formed on the intermediate electrode 8, rises together with the intermediate electrode 8. Similarly, the switching portion 130, which is formed on the support base 6 and has the V-shaped groove structure and the microprism 3, moves to the first position. Consequently, the incident light 170 travels from the light guiding portion 1 through the extraction surface 32 and the microprism 3 to the reflection surface 4, which reflects the incident light 170. Thus, an optical signal is outputted therefrom as output light 172.

On the other hand, in an off-state illustrated in FIG. 2(b), DC power is supplied from the power supply portion 11 to the address lower electrode 9 by switching the power supply switch 12. Therefore, an electrostatic force generated between the address lower electrode 9 and the intermediate electrode 8 downwardly pulls the intermediate electrode 8.

Thus, the support base 6, which is formed on the intermediate electrode 8, falls down to the side of the silicon substrate 10 together with the intermediate electrode 8. Similarly, the switching portion 130, which is formed on the support base 6 and has the V-shaped groove structure and the microprism 3, moves to the second position together therewith. Therefore, the extraction surface 132 is detached from the light guiding portion 1, so that the incident light 170 is not extracted but reflected on the total reflection surface 122. Thus, the output light 172 is not outputted from the light guiding portion 1. Further, no optical signal is outputted therefrom as an evanescent wave.

Method for Manufacturing Spatial Light Modulator

Next, a method of manufacturing the spatial light modulator 110 is described hereunder with particular emphasis on the optical switching elements 100. Especially, the drive portion 140 and the switching portion 130 of the optical switching elements 100 are manufactured by performing the micromachine manufacturing method of the present invention which is described in detail hereinbelow.

Figure 3:
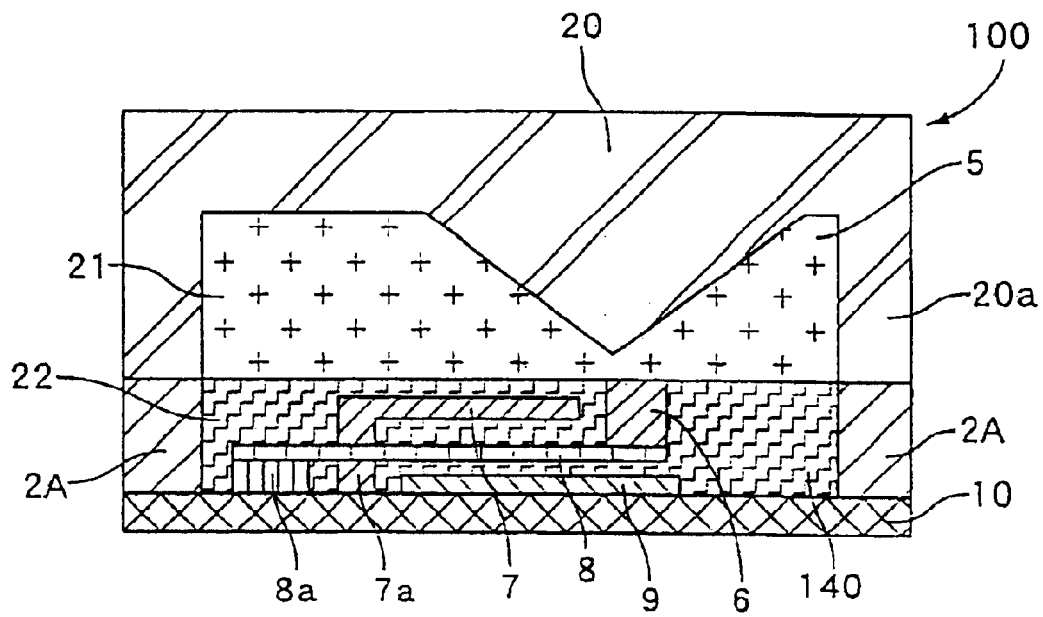
FIG. 3 is a diagram illustrating a manufacturing process of the optical switching element shown in FIGS. 2(a)–(b), and illustrating a step of manufacturing a structure, which has a V-shaped groove, by mold transfer.
Figure 4:
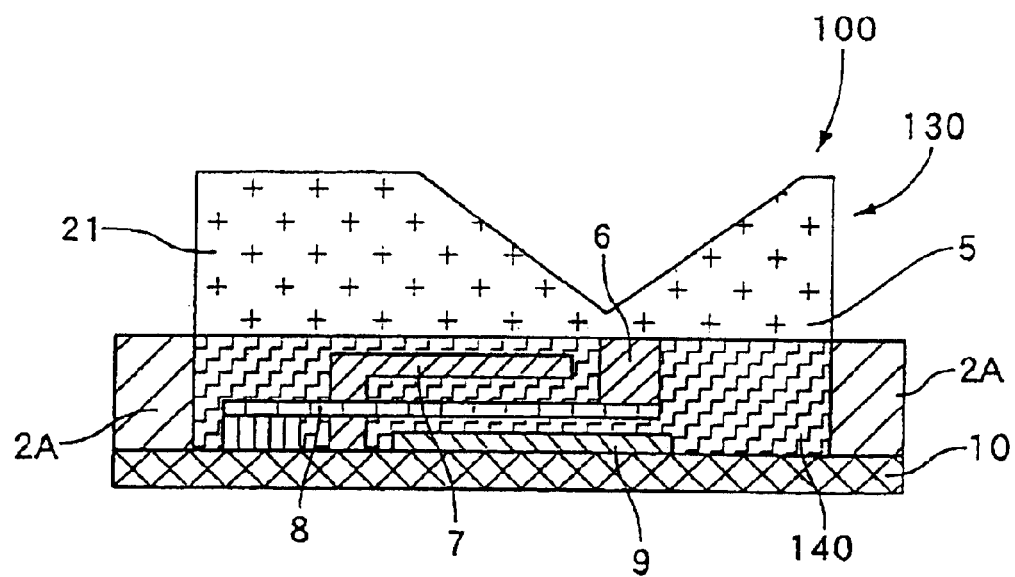
FIG. 4 is a diagram illustrating a manufacturing process of the optical switching element shown in FIGS. 2(a)–(b), and illustrating the state thereof, in which the V-shaped groove is formed.

Next, a method of manufacturing this optical switching element 100 is described hereunder. FIGS. 3 and 4 are diagrams illustrating the step of forming the V-shaped groove structure 5 of the switching portion 130 in the process of manufacturing the optical switching element. Before this step, the drive portion 140 having a three-layer structure is manufactured by photolithography techniques. That is, the address lower electrode 9 serving as a first layer is formed on the silicon substrate 10. The intermediate electrode 8 and the support, base 8a are formed thereon as a second layer. Further, the address upper electrode 7 and the support base 7a are formed thereon as a third layer.

These layers are manufactured as follows. First, the address lower electrode 9 of the first layer is a polysilicon layer formed on the silicon substrate 10 by plasma CVD. Unnecessary part thereof is removed therefrom by performing the photolithography step and the etching step. Any conductive material may be employed as the material of the address lower electrode 9. Metallic films made of aluminum, platinum, copper, and gold may be used as the material thereof. Further, the address lower electrode 9 may be formed by doping the silicon substrate 10 with boron. When this address lower electrode 9 is formed, other manufacturing methods, such as sputtering, deposition, or ion implantation, may be employed. Furthermore, the post 2A, an intermediate electrode post 8a for supporting the intermediate electrode 8, and the address-upper-electrode support base 7a for supporting the address upper electrode may be formed, concurrently with the formation of the address lower electrode 9.

Subsequently, an area formed by removing the unnecessary part by etching is filled with an $SiO_2$ sacrifice layer 22 by performing plasma CVD. Further, unnecessary sacrifice layer portions of the post 2A, the address-upper-electrode support base 7A, the intermediate electrode 8, and the support base 8a therefor are removed at the photolithography step and the etching step. Thereafter, a polysilicon layer is stacked thereon by performing the plasma CVD. Thus, the second layer is formed. Then, the third layer is similarly formed by repeating the photolithography step and the etching step. Thus, the drive portion 140 is formed by the photolithography step and the etching step.

When the drive portion 140 is manufactured, the resin 21 is applied onto the drive portion 140 without eliminating the sacrifice layer 22 stacked so as to manufacture each of the layers of the drive portion 140. Then, a mold 20 for forming the V-shaped groove structure 5 is pressed against the resin 21, so that the shape of the V-groove is transferred. Although a thermosetting resin, an epoxy dry resin, a polycarbonate resin, a polyimide resin, and an ultraviolet resin may be used as the resin 21, the manufacturing method in the case of using an ultraviolet-set resin is described by way of example. Examples of the ultraviolet-set resin are radical polymerization resins, such as an unsaturated polyester resin, an acryl type or polyester acrylate resin, a polyester acrylate resin, a urethane acrylate resin, an epoxy acrylate resin, a polyether acrylate resin, an acrylate resin of the type including an acryloyl group on the side chain thereof, a thiol-ene type polythiol acrylated drivative, and a polythiol spiroacetal resin, and cationic polymerization resins, such as an epoxy type or epoxy resin. These resins may be used.

Manufacture of Mold for Transfer

The manufacture of the mold for transfer is described hereinbelow. A mold 20 of this example is a secondary mold. First, a primary mold is formed on the silicon substrate by the photolithography technique. Subsequently, resist is applied to the silicon substrate. The applied resist is then masked and exposed. Thereafter, unnecessary part of the resist is removed. Further, etching is performed on the substrate by using KOH solution. At that time, the etching is performed by adjusting an orientation plane of crystals of a wafer (thus, the silicon substrate) and a mask to the (1,1,0) plane. Therefore, the anisotropic etching progresses at an etching angle of 54.74 degrees. Thus, the etching progresses from both sides of the substrate at an angle of 54.74 degrees. Consequently, the etching is performed by forming an inverse triangle hole, whose vertex angle is 109.48 degrees, in the substrate. When the depth of this inverse triangle reaches a predetermined depth, the resist is removed. Then, the resist is applied again to the surface of the substrate.

Next, when the switching portion 130 having the V-shaped groove structure 5 is used as the second microstructured portion, the masking and exposing of the resist are performed so as to form the post 2 of the shape to be used as the third microstructured portion adjacent to the second microstructured portion. Then, dry etching is performed by using $SF_6$, which is a fluoride gas, so that isotropic etching is affected in a vertical direction. The depth obtained by this etching is that at which the post 2 is formed, and that of a portion 20a at which the lower half portion of the post for the drive portion 140 touches the secondary mold. The portion 20a acts as a stopper for controlling the relationship in height between the drive portion 140, which serves as the first microstructured portion, and the switching portion 130, which serves as the second microstructured portion. Furthermore, a second structure (the switching portion 130) and a third structure (the post 2) are formed in the same silicon substrate, which used as the primary mold, by etching. Therefore, the second and third microstructured portions can be formed by mold transfer using the same mold and by using the secondary mold formed in this way.

Although the primary mold for forming such a V-shaped groove can be manufactured by machining and using a metallic material, a glass material, or a plastic material, this embodiment forms a V-shaped groove structure, which has a predetermined tapered angle (54.74 degrees), by providing an oxide film on the silicon substrate and adjusting the orientation plane of crystals of the silicon substrate to the (1,1,0) plane, and performing the photolithography step and the anisotropic etching. Further, vertical etching is performed by performing the photolithography step and the isotropic etching. The depth at which the post 2B is formed is determined by controlling the depth of the vertical etching. This enables the controlling of the thickness of and the positioning of the switching portion 130.

Ultraviolet-set epoxy resin is applied onto the primary mold formed in the silicon substrate in this way, and then cured by ultraviolet rays. Thus, the secondary mold, which is the inverse of the primary mold, is obtained as the transfer mold 20 shown in FIG. 3. Further, the use of this secondary mold enables the curing of a resin by irradiating the resin with ultraviolet, which is impossible in the prior art using the silicon mold. Thus, the V-shaped groove structure 5 of the switching portion 130 serving as the second microstructured portion can be formed by using the ultraviolet-set resin.

Furthermore, the resin 21 is cured by irradiating the resin 21 with ultraviolet rays from the outside of the transmissive secondary mold 20. This figure illustrates a state, in which the secondary mold 20 is thereafter removed. The V-shaped groove structure 5 is formed on the drive portion 140, which acts as the first microstructured portion, by using the cured resin 21. At this stage, the resin 21 molded by mold transfer is formed over a wide range other than the post 2A having a die-matching function. Further, the thickness of the resin 21 is controlled according to the thickness (or depth) of the portion, which serves as the stopper 20a for the secondary mold 20 and is obtained by performing isotropic etching on the primary mold.

Moreover, in the case that the V-shaped groove structure 5 is formed by irradiating the resin 21 with ultraviolet rays from the outside of the transmissive secondary mold 20 to thereby cure the resin 21, the pattern of the secondary mold can be improved by forming a metallic film, whose thickness is small to the extent that this film transmits light, on the transfer surface of the secondary mold 20. Preferably, the used metallic film contains aluminum, nickel, platinum, copper, gold, iron, titanium, or an alloy containing such metal. The sufficient thickness of the metallic film is about 10 to 1000 Å. For instance, in the case of using a nickel film as the metallic film, the pattern of the secondary mold 20 can be improved, without curing the resin 21 of the V-shaped groove portion, by forming a film, which is about 50 Å in thickness, on the transfer surface of the secondary mold 20.

Manufacture of Reflection Surface

Figure 5:
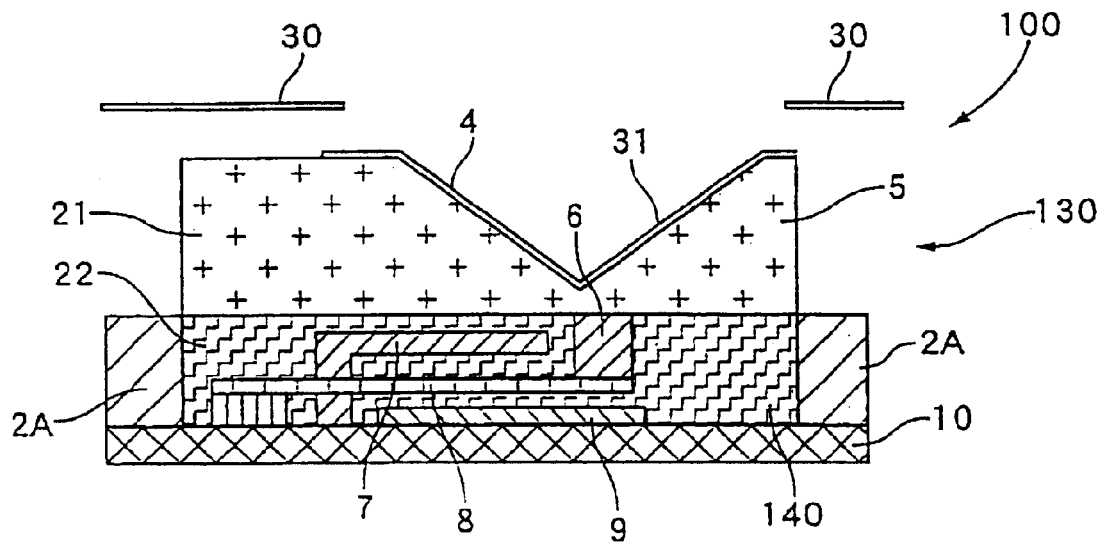
FIG. 5 is a diagram illustrating a manufacturing process of the optical switching element shown in FIGS. 2(a)–(b), and illustrating a step of manufacturing a reflection surface.

Film formation of the reflection surface 4 is described hereinbelow with reference to FIG. 5. A film 31 serving as the reflection surface 4 for optical switching is formed on the resin 21 from which the V-shaped groove structure is formed. Although the reflection film 31 can be formed by using a high-reflectivity metallic film containing aluminum, platinum, silver, gold or the like, and performing deposition, sputtering, or plasma CVD, an example of forming such a film by sputtering is described hereunder this time. First, the drive portion 140 serving as the first microstructured portion is manufactured on the silicon substrate 10 by performing the photolithography step and the etching step. The resin 21 to be formed as the V-shaped groove structure 5 is transferred onto the drive portion 140 by mold transfer, and then fixed to a tray of a sputtering machine. At that time, concurrently with this, a mask for suppressing the formation of the reflection film is fixed in an area other than the V-shaped groove structure. An upper part of the post 2 and an unnecessary part of the resin 21, which is formed by the mold transfer and should be removed later, are covered by the mask 30. This prevents such parts from containing metallic materials which hinder the manufacture of the post 2 and the etching. Thus, the accuracy of formation of the post 2, which is performed later, can be enhanced. Furthermore, the etching of the unnecessary part is efficiently achieved.

However, regarding this mask 30, it is necessary for forming the film by fully covering the V-shaped groove structure portion that a range, which is a little larger than the V-shaped groove structure portion, is removed from the mask region, namely, opened. Thus, the reflection film 31 is formed on the part of the resin 21 which is to be formed as the V-shaped groove structure 5, by performing such masking, and sputtering. Experiments conducted by inventors of the present invention have verified that when a film is formed on a more minute V-shaped groove structure, a more uniform reflection film 31 is obtained in the case of providing no mask, as compared with the case that the mask is provided as described above.

Manufacture of Extraction Surface

Figure 6:
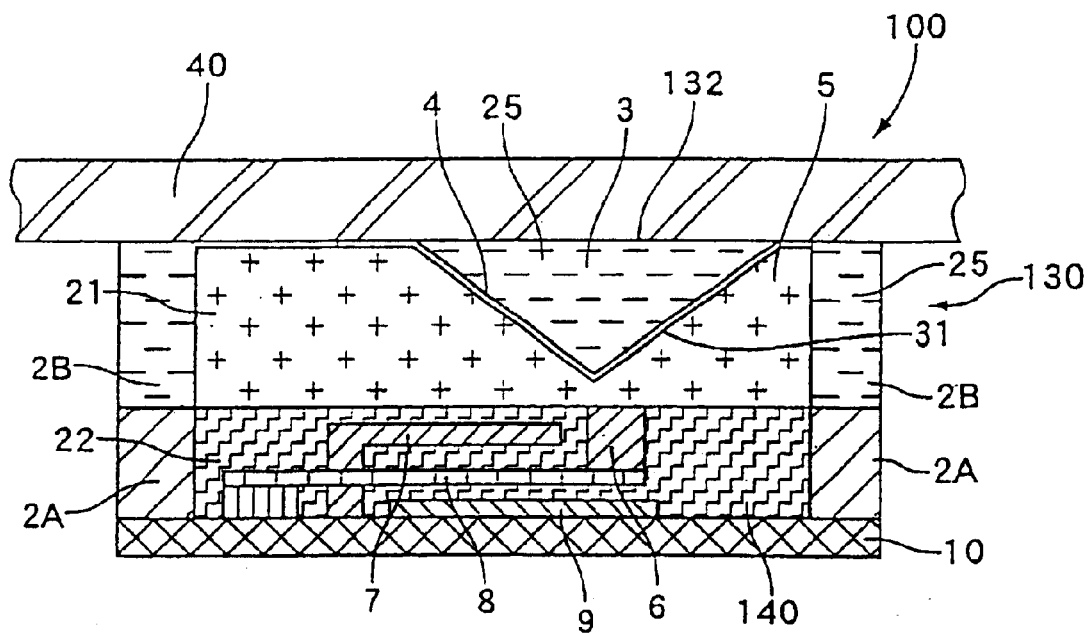
FIG. 6 is a diagram illustrating a manufacturing process of the optical switching element shown in FIGS. 2(a)–(b), and illustrating a step of manufacturing a prism.

Next, the formation of the microprism 3 and the post 2B is described hereinbelow with reference to FIG. 6. At this step, the microprism 3 and the flat surface thereof are formed by using a planarizing die 40, so that the flat surface is formed as an extraction surface 132. Moreover, the planarizing die 40 performs the function of determining the height of the post 2B. As long as an accurately flat surface can be realized, any material, for example, glass, plastics, metal, or silicon may be employed as the material of the planarizing die 40. In the case of this example, as previously described, the prism 3 is formed by using the aforementioned ultraviolet-set resin. Therefore, quartz glass, which can transmit ultraviolet, is used as the material of the planarizing die 40.

Ultraviolet-set resin 25 is applied on a reflection film 31 formed by performing sputtering on the resin 21, in which the V-shaped groove structure is formed, and on the post 2A. Then, the planarizing die 40 is put on these components. Further, ultraviolet rays are irradiated from the side of the planarizing die 40. The ultraviolet-set resin is cured by being irradiated with ultraviolet rays. Thus, the microprism 3 is formed on the reflection film 31 that is formed on the V-shaped groove structure 5 and that intervenes between the microprism 3 and the V-shaped groove structure 5. Simultaneously, the ultraviolet-set resin filled in a portion provided on the post 2A is also cured, so that the post 2B is formed. At this step, it is desirable for planarizing a portion provided among the microprism 3, the planarizing die 40, and the post 2B with higher precision that during the planarizing die 40, which is not irradiated with ultraviolet rays yet, is provided therein, the silicon substrate 10 is put into a chamber, and then the chamber is evacuated until a vacuum condition is realized therein, and thereafter, the silicon substrate 10 is left therein as it is, under a vacuum condition. Gas dissolved into the resin is discharged by reducing the ambient air pressure of the resin to thereby realize an almost vacuum condition, and by maintaining the ambient air pressure at a value that is lower than the atmospheric pressure. Thus, there is no influence of bubbles contained in the resin 25. Consequently, the entire surface of the resin 25 is uniformly in intimate contact with the planarizing die 40, so that a further flat extraction surface 132 is formed.

Thus, the inner structure of the switching portion 130 serving as the second microstructured portion and the outer structure thereof, which requires high surface accuracy, are produced. The travel of the switching portion 130 during the modulation of light by the drive portion 140 is in the submicron order, for instance, about 0.5 $\mu$m. Therefore, the size of the entire switching portion 130 is in the micron order. Further, higher accuracy, namely, accuracy of submicron order is needed as the surface accuracy of the extraction surface. Further, the distance therefrom to the post 2 is in the submicron order or in the micron order. It is, therefore, very important for stably performing a switching operation that the portions, among which interference may occur, are reliably manufactured with precision of submicron order. At the aforementioned step, such portions requiring high precision are manufactured by mold transfer. The surfaces of the microstructured portions and the gap or step provided therebetween can be controlled with accuracy, which is of the order of the accuracy of the die. Further, the repetitive use of such a die can provide switching elements 100 of stable quality, and spatial light modulators 110 using such switching elements.

Especially, in the case that the spatial light modulator 110 comprises a plurality of switching elements 100, it is demanded that the switching elements 100 of the same configuration are produced in a small area. According to the method of the present invention, a plurality of switching elements can be simultaneously formed by using the same die. Moreover, because of use of the mold transfer, there is little variation in quality. Therefore, switching elements and spatial light modulators of high yield can be easily provided in a short time at low cost.

Removal of Unnecessary Part

Figure 7:
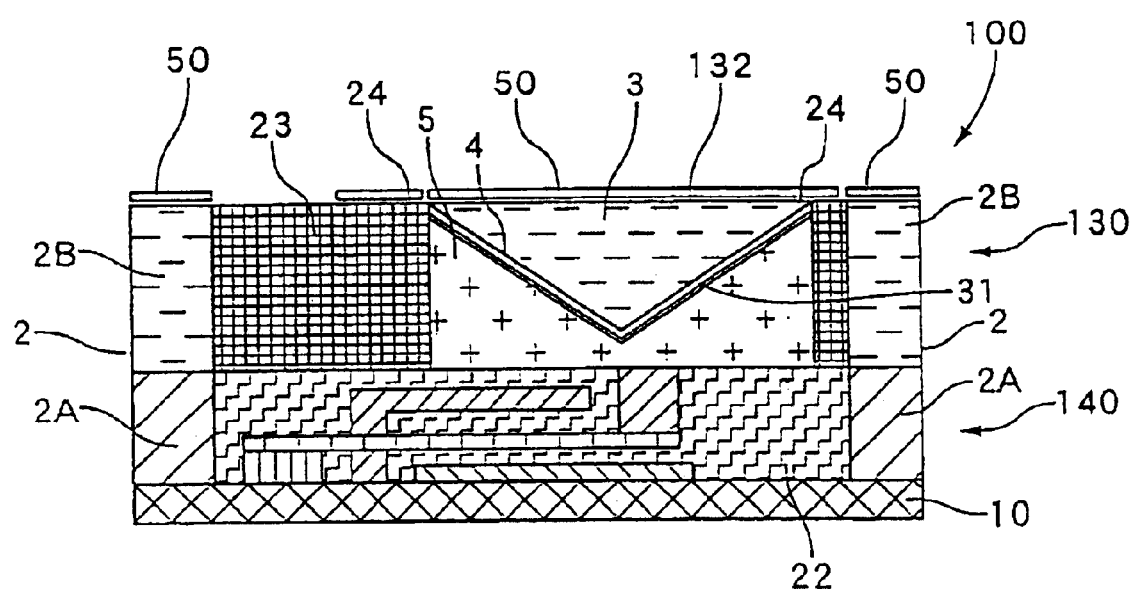
FIG. 7 is a diagram illustrating a manufacturing process of the optical switching element shown in FIGS. 2(a)–(b), and illustrating a step of removing an unnecessary part therefrom.

Next, the step of manufacturing the switching portion 130 by removing the unnecessary part 23 of the V-shaped groove structure 5 formed by using the mold transfer, as described above, is described hereinbelow with reference to FIG. 7.

To remove unnecessary resin 23 at cured parts, which are filled in the area hindering the movement of the switching portion 130, among the portions formed by the mold transfer as described above, first, resist is applied onto the upper portion of the switching portion 130 and the upper portion of the post 2. Then, a mask 50 is formed on both the upper portion of the post 2 and the upper portion of the switching portion 130 by using the photolithography techniques. Upon completion of the formation of the mask 50, the unnecessary resin 23 is removed by etching. Moreover, the unnecessary reflection film 24 projected from the mask 50 is removed by etching. Furthermore, the sacrifice layer 22, which has not been removed so as to protect the drive portion 140, is simultaneously removed by etching. Thus, the switching portion 130 serving as the second microstructured portion is formed on the movable first microstructured portion by the mold transfer. Regarding this etching, wet etching is suitable for removing the unnecessary part of the resin, while dry etching is suitable for removing the unnecessary part of the metallic reflection film. Furthermore, the unnecessary resin 23 can be removed by being irradiated with laser light from an excimer laser. Regarding the removal of the sacrifice layer 22, this removal can be achieved by wet etching using hydrofluoric acid.

As described above, when the second microstructured portion for switching is transferred onto the first microstructured portion, which serves as the drive portion, by the mold transfer, it is desirable that the transfer is performed in a state in which the microstructured portion is fixed by using the sacrifice layer 22. This is because the second microstructured portion can be formed without impairing the function of the first microstructured portion serving as the drive portion. Further, in the case that the mask 50 formed at the photolithography step is removed at the end of all steps, a micromachine having the drive portion 140 and the switching portion 130 of the switching element 100 can be manufactured without deteriorating the light extraction surface 132 of the microprism 3 of the switching portion 130. The optical switching element 100 is completed by putting the light guiding portion 1 on the upper part of the post 2 in this state, and then fixing this light guiding portion 1.

In the case of the switching element 100 manufactured by the manufacturing method of the present invention, the hardness thereof is low in comparison with that of the element formed from a glass material in the case that a micromachine is formed by using the resin. Furthermore, the flatness of the light extraction surface 132 can be ensured by the mold transfer. Therefore, owing to both factors, the adhesiveness between the extraction surface 132 and the light guiding portion 1 is enhanced. Consequently, a more stable switching operation and a high-contrast spatial light modulator can be realized.

Another Example of Spatial Light Modulator

Figure 8:
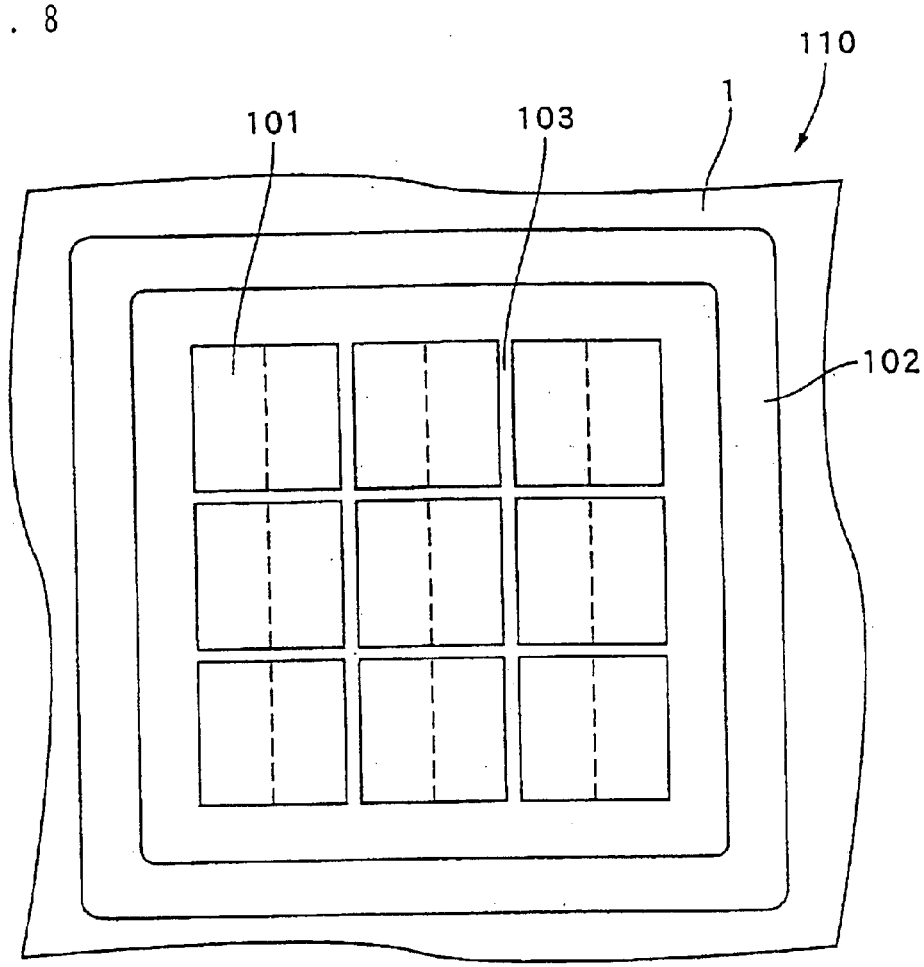
FIG. 8 is a plan diagram illustrating the configuration of a spatial light modulator, which is other than the aforementioned spatial light modulator.
Figure 9:
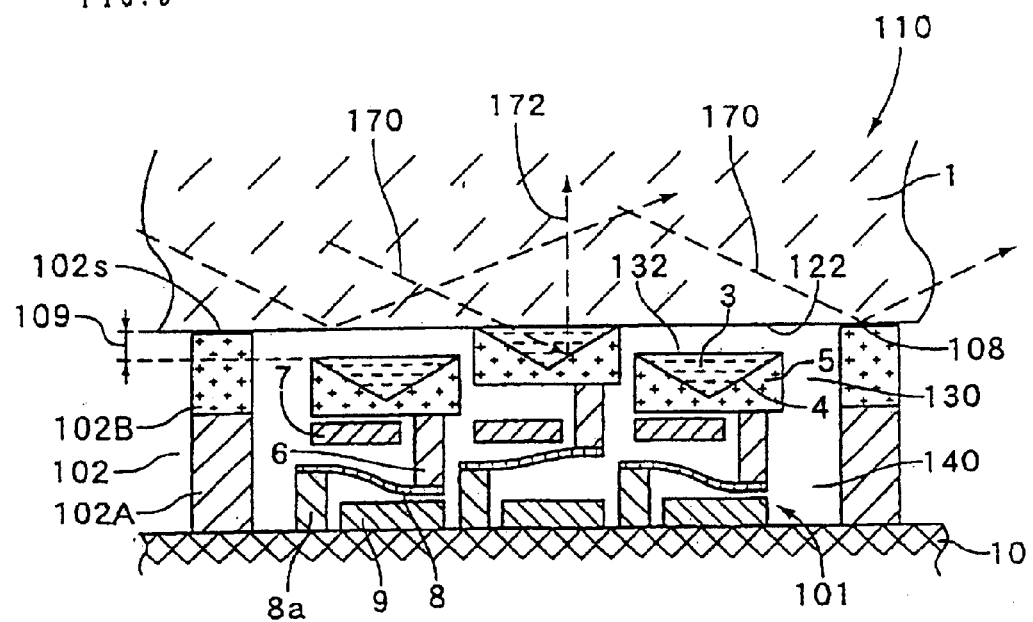
FIG. 9 is a sectional diagram illustrating the configuration of the spatial light modulator shown in FIG. 8.

FIGS. 8 and 9 illustrate another example of the spatial light modulator 110 utilizing evanescent waves. This spatial light modulator 110 is an active optical element in which 3×3 optical switching elements 101 are arranged in an array by providing a distance interval 103 between adjacent elements. Further, a support wall 102 is provided in such a way as to surround these optical switching elements 101 arranged in an array. The light guiding portion (namely, a light introducing prism) 1 is supported by the support wall 102. Each of the optical switching elements 101 has the optical switching portion 130 and the drive portion 140 for driving this portion 130, similarly as the aforementioned optical switching element does. The drive portion 140 has a lower electrode 9, which is formed on the surface of the silicon substrate, and an upper electrode 7 placed above this electrode 9, and an intermediate electrode 8 adapted to move between the upper electrode 7 and the lower electrode 9. The drive portion 140 drives the switching portion 130 by using an elastic force of the intermediate electrode 8 and an electrostatic force acting by providing a difference in electric potential between these electrodes. Furthermore, the optical switching portion 130 serving as a micro-optical element has a V-shaped reflection surface 4. An upper part of this V-shaped reflection surface 4 is the prism 3 filled with a transparent member. Light (namely, evanescent light) is extracted from the light guiding portion 1 by bringing the top surface of the prism 3, which is a flat surface, into intimate contact with the total reflection surface 122 of the light guiding portion 1. Therefore, in the case of the optical switching element 101, similarly as in the case of the aforementioned switching element, a light ray 170 is obliquely incident on the bottom surface 122 of the light introducing prism 1. The incident light 170 undergoes total reflection because a space is provided between the top surface of the micro-optical element 101 and the bottom surface 122 of the light introducing prism when the switching portion 130 is moved downwardly by the actuator (or drive portion) 140. On the other hand, when the optical switching portion 130 serving as the micro-optical element is moved upwardly by the actuator 140, and the top surface 132 of the optical switching portion 130 is in contact with the bottom surface 122 of the optical introducing prism, the incident light having been obliquely incident upon the bottom surface 122 of the light introducing prism is transmitted by the top surface of the micro-optical element 130 and then outputted upwardly as a light ray 172. Incidentally, the more detail of the movement of the incident light is similar to that in the case of the aforementioned optical switching element. Thus, the description of the more detail of the movement of the light 170 is omitted herein.

A wall 102 is a structure surrounding the optical switching elements 101 arranged in an array. The wall 102 enables the filling of the space 205, in which the optical switching elements 101 are arranged in an array, with an inactive gas, and can be sealed by increasing or decreasing the inner pressure of the gas in such a manner as to be higher than the ambient pressure, for instance, the atmosphere pressure. Thus, the optical switching elements 101 are protected. The reliability and durability can be drastically enhanced.

On the other hand, the wall 102 has functions of touching the bottom surface 122 of the light guiding portion, and-fixing the light guiding portion 1. The wall 102 supports the light guiding portion 1. This ensures a distance interval, by which the switching portion 130 reliably moves to a position (a first position), at which the portion 130 touches the total reflection surface 122 of the light guiding portion, and to a second position at a distance (equal to or more than 0.5 μm) therefrom, at which total reflection light does not enter the optical switching portion 130. Thus, these portions are manufactured by the mold transfer, so that a step 109 is provided between the top surface 102s of the wall 102 and the extraction surface 132 of the switching portion 130.

Manufacture of Step

A method of forming a step 109 is described with reference to FIGS. 10(a)–(d).

Figure 10:
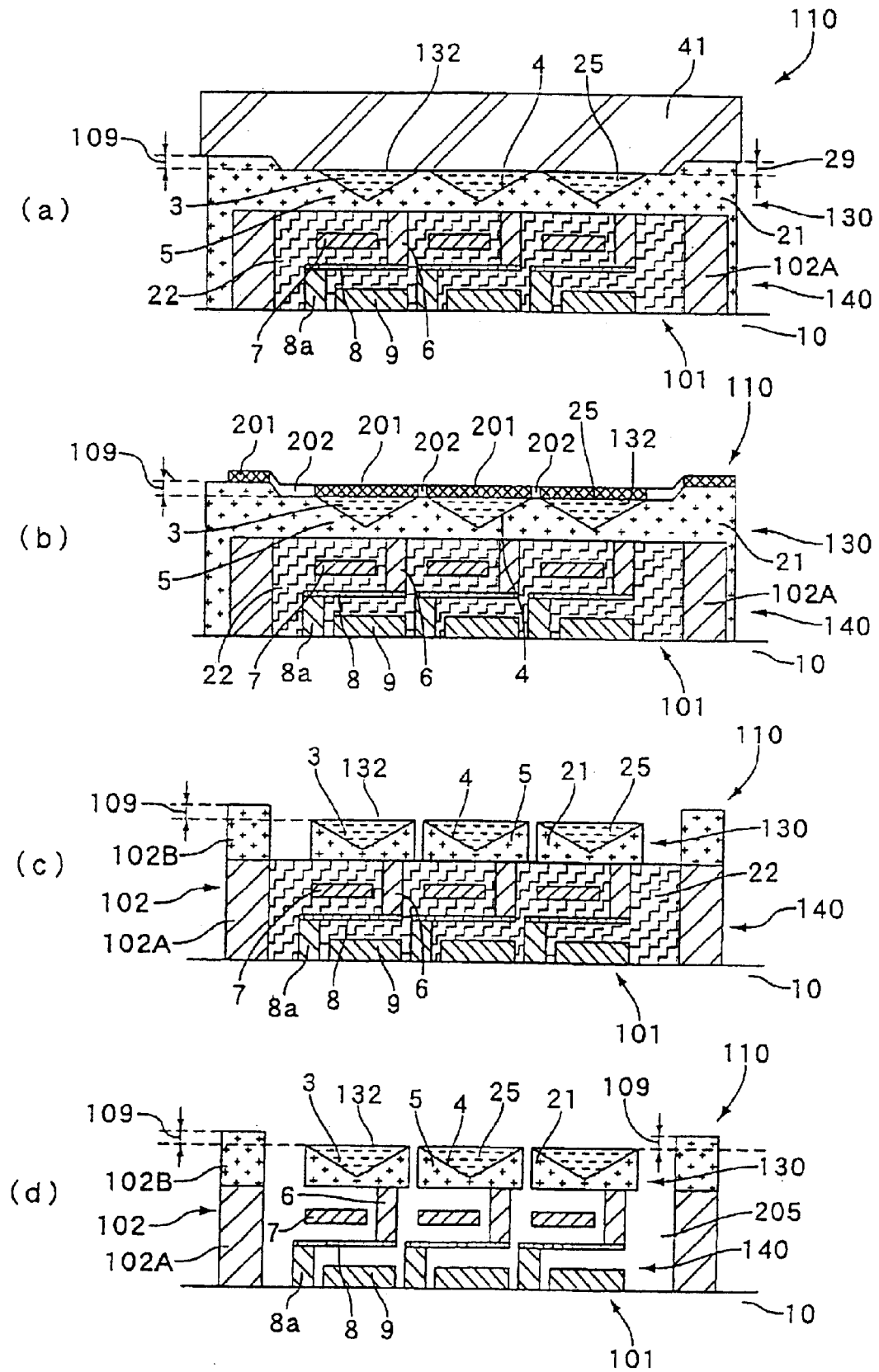
FIGS. 10(a)–(d) is a diagram illustrating a manufacturing process of the spatial light modulator shown in FIG. 9.

FIG. 10(a) is a diagram illustrating how the actuator structure (namely, the drive portion) 140 serving as the first microstructured portion for moving the switching portion (namely, the micro-optical element) 130 acting as the second microstructured portion is produced by the photolithography step, and how the original form of the switching portion 130 is produced by resin molding before the sacrifice layer 22 is etched. At this stage, the lower electrode 9, the intermediate electrode 8, the upper electrode 7, and a support 6 or connecting the intermediate electrode 8 to the switching portion 130 are already completed. The sacrifice layer 22 is filled in the gap among these components. Similarly as in the case of the aforementioned example, a structure serving as a V-shaped reflection mirror is formed on this drive portion 140 from resin by mold transfer. Furthermore, a transparent resin 25 is filled in the V-shaped groove 5. Thereafter, the resin 25 is covered by a mold 41 having the step 109. The top surface of the transparent resin filled in the V-shaped groove is planarized by this transfer mold 41. Simultaneously, the step 109 between the top surface of this resin and the top surface 102s of the wall 102 is accurately formed.

Thereafter, as illustrated in FIG. 10(b), a resist film 201 is applied thereto, and the patterning of an etching pattern 202 is performed by using a mask. Subsequently, a part 202 removed from the resist film 201 is vertically etched by patterning. As a result, when the resist 201 is removed, the shape illustrated in FIG. 10(c) is obtained. Even when etching is performed on the resin, the sacrifice layer 22 is not etched. Thus, the surface of the sacrifice layer 22 is exposed. Therefore, etching is thereafter performed on the sacrifice layer, so that the sacrifice layer 22 is removed. Consequently, as illustrated in FIG. 10(d), a space 205, in which the actuator of the drive portion 140 can work by electrostatic force, is produced.

Thus, a step 109 formed in the mold 41 with very high accuracy by etching. The extraction surface 132 of the optical switching portion 130 serving as the second microstructured portion and the top surface 102s of the support wall 102 can be formed by using the same mold by transferring this mold 41. Because of the use of the same mold, the step is accurately transferred therebetween. As a result, the step 109 having an accurate size, which is in the submicron order, can be easily formed.

Moreover, in the spatial light modulator 100 of this example, a resin support portion 102B formed by the transfer is present on a lower half portion 102A extending upwardly from the silicon substrate 10. Therefore, a reflection film 108 is deposited on the top surface 102s. Thus, this modulator is adapted so that the light ray 170 propagating in the light introducing portion 1 is reflected by the reflection film 108, which is provided on the top surface of the step 102, in a direction that is the same as a direction in the case of the total reflection. Therefore, even when the top surface 102s of the step made of resin is brought into intimate contact with the total reflection surface 122 of the light introducing portion 1, the resin portion 102B provided at the upper portion of the step transmits the light ray 170, so that no scattering light is generated. Thus, there is provided a reliable active optical element having a very high S/N for the optical switching.

Example of Manufacture of Micromachine Optical Switch

In the foregoing description, it has been described that a structure having an optical switching portion, which can modulate-light by extracting evanescent light, and a drive portion for driving this switching portion is designed as an example of a micromachine according to the present invention, and that the designed structure is manufactured by the micromachine manufacturing method of the present invention. Hereinafter, further, a micromachine optical switch is described by way of example. The micromachine optical switch is operative to switch data to be communicated through an optical fiber. Thus, the optical switch is configured so that a transmission line part of an optical fiber is cut and that light is projected by using the space. A light shielding object fixed on the actuator is placed in the space, and moved by the actuator. Consequently, light transferred between optical fibers is shielded by the light shielding object, or the light shielding object is evacuated to an area which does not hinder optical communication. Therefore, signals transmitted between optical fibers can be switched by using the micromachine.

Figure 11:
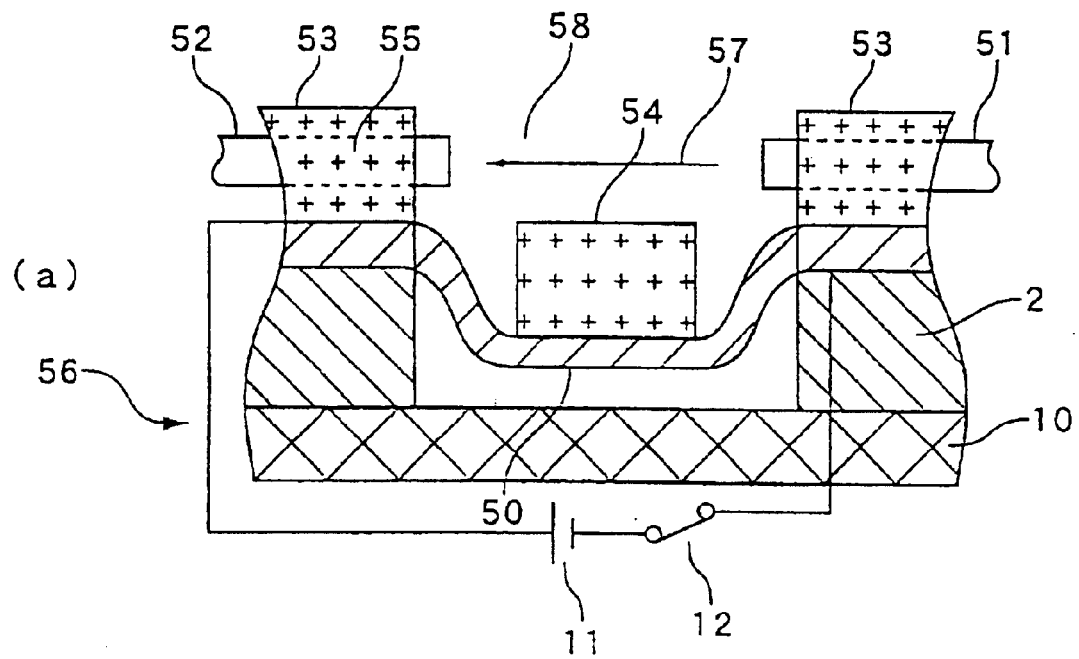
FIGS. 11(a)–(b) are diagrams illustrating the configuration and operation of a micromachine optical switching device according to the present invention.
Figure 11:
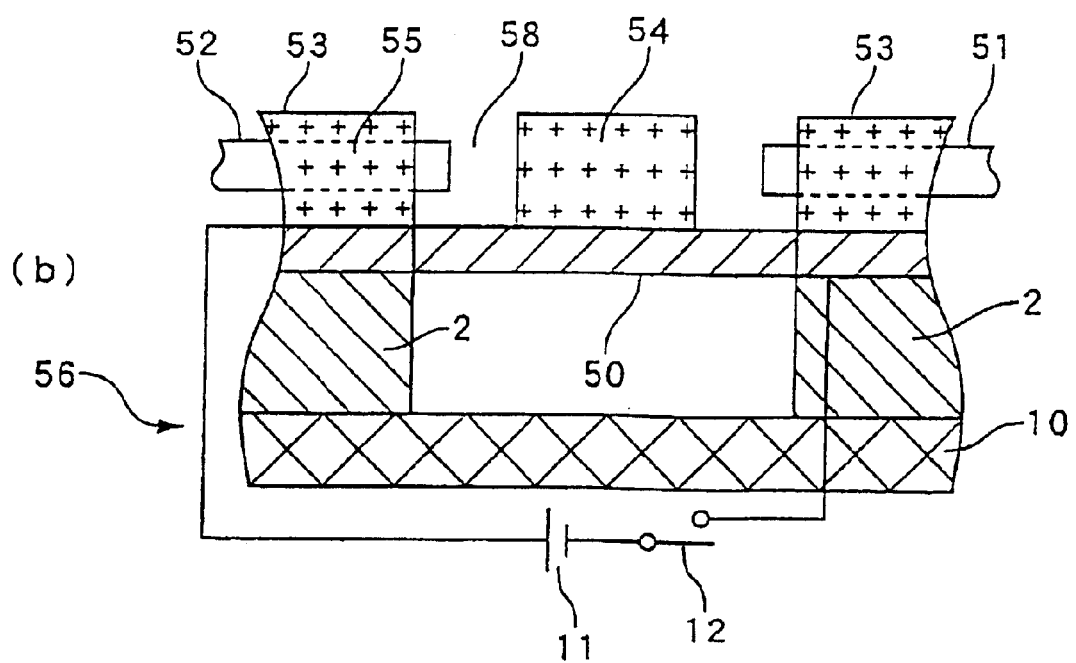

FIGS. 11(a)–(b) illustrate the micromachine optical switch 56 having a structure according to the present invention. In the case of the micromachine optical switch 56 of this example, in a state shown in FIG. 11(a), the light shielding object 54 is evacuated to an area in such a manner as not to hinder the transmission of an optical signal 57. An optical signal 57 outputted from an output-side optical fiber 51 is received by a light-receiving side optical fiber 52 through a space 58. Thus, the optical signal 57 is transmitted therebetween. On the other hand, in a state illustrated in FIG. 11(b), the light shielding object 54 is present in the space 58, and shields the optical signal 57. Thus, the optical signal 57 is not transmitted to the light-receiving side optical fiber 52. In this manner, the micromachine optical switch 56 of this example can switch on and off the optical signal 57 to be transmitted in the space 58 using the shielding object 54.

The configuration of the micromachine optical switch 56 is described hereinbelow in more detail. A piezoactuator 50 serving as the first microstructured portion and driving the light shielding portion 54, which serves as the second microstructured portion, is disposed on the silicon substrate 10 in which a circuit 11 for driving the actuator 50 is incorporated. The drive circuit 11 is a power supply circuit 11 and controls the supplying of electric power to the piezoactuator 50 using the switch 12. The post 2 extends from the surface of this silicon substrate 10. Thus, the piezoactuator 50 and the optical fiber fixing base 53 are fixed onto the silicon substrate 10 by this post 2.

Even in the case of this example, the piezoactuator 50 of the drive portion serving as the first microstructured portion, and the post 2 are manufactured by performing the photolithography step. The light shielding object 54 serving as the second microstructured object for shielding the optical signal 57 in response to an operation of the piezoactuator 50 is manufactured thereon by mold transfer. Further, an optical fiber fixing base 53 serving as the third microstructured portion is manufactured on the post 2 by the mold transfer. An optical fiber fixing V-shaped groove for fixing an optical fiber is formed in the fixing base 53 by the mold transfer.

In the micromachine optical switch 56 of this example, this piezoactuator 50 serving as the movable first microstructured object expands or contracts owing to charges supplied to the upper and lower sides thereof when the power is switched on or off by the switch 12. In the case of this example, when deformation occurs in a piezo-thin-film, which acts as the piezoactuator 50, correspondingly to an on-state (FIG. 11(a)), the piezo-thin-film deforms to the side of the silicon substrate 10. At that time, the light shielding object 54 serving as the second microstructured object, which is formed on the actuator serving as the first microstructured object, is evacuated to the position, at which the light shielding object 54 does not hinder the propagation of the optical signal 57 to be transmitted in the space 58 from the output side optical fiber 51 to the light receiving side optical fiber 52. Thus, the optical signal is transmitted from the output side optical fiber 51 fixed at the optical fiber support base 53 to the light receiving side optical fiber 52.

Next, when the supply of charges to the piezoactuator 50 is interrupted by switching the power supply switch 12, the expansion or contraction of the piezo-thin-film of the piezoactuator 50 is cancelled and the shape thereof is restored to the original shape, as illustrated in FIG. 11(b). Thus, the light shielding object 54 formed on the piezoactuator 50 by the mold transfer is adapted to move to the space 58 between the optical fiber support bases 53 serving as the third microstructured objects, which are formed on the post 2. Therefore, the optical signal 57 sent from the output side optical fiber 51, which is fixed to the optical fiber support base 53, to the light receiving side optical fiber 52 is interrupted, so that no propagation of the optical signal 57 is stopped.

In the micromachine optical switch 56 of this example, an optical fiber fixing V-groove 55 formed by the mold transfer in the optical fiber fixing base 53 for fixing an optical fiber. Therefore, the output side optical fiber 51 and the light receiving side optical fiber 52 can be accurately and easily fixed to predetermined positions. Further, the light shielding object 54 serving as the second microstructured portion, the optical fiber fixing base 53 serving as the third microstructured portion, and the optical fiber fixing V-shaped groove 55 are manufactured from the same mold by transferring. Thus, the relationship in position among these components is determined with very high precision. Hence, the optical signal 57 can be reliably switched on and off by the light shielding object 54 only by attaching the optical fibers 51 and 52 thereto without positioning the output side optical fiber 51, the light receiving side optical fiber 52, and the light shielding portion 54.

Moreover, the center line of the output side optical fiber 51 can be made to accurately coincide with that of the light receiving side optical fiber 52 only by positioning each of the fibers to the optical fiber fixing V-shaped groove 55, because the output side optical fiber 51 and the fixing base 53 of the light receiving side optical fiber 52 serving as the third microstructured portion are manufactured from the same mold by being transferred. Thus, the attenuation of the optical signal 57 propagating in the space 58 can be minimized when the signal 57 is received by the light receiving side optical fiber 52. Further, the micro-optical switches 56 of the same performance can be manufactured by being arranged in one-dimensional, two-dimensional, or three-dimensional array, and by transferring from the mold. It is considered that this can be applied to the input/output of the optical computing, or to switching elements of other information processing systems.

Although the optical switches of this examples are an example of using optical fibers, needless to say, waveguides may be respectively provided corresponding to both of the sides, instead of the optical fibers, and the light shielding portion may be moved therebetween. Further, the shape of the groove for fixing the optical fibers is not limited to of a letter V. Needless to say, a rectangular groove, and a U-shaped groove may be employed.

Method of Manufacturing Micromachine Optical Switch

A method of manufacturing a micromachine optical switch, which is an example of a micromachine, is described in more detail. In this micromachine, the first microstructured object is formed on the base. Thus, such components may be formed on the metallic plate, such as a silicon substrate, and an aluminum plate, by utilizing not only the photolithography step, which is a silicon process, but also the thin film forming step using the metallic film deposition using metallic films, which contain silicon, silicon nitride, silicon nitrate, silicon oxide, aluminum, platinum, gold, nickel, copper, and brass, and etching, such as dry etching and wet etching, evaporation, CVD, sol-gel process, and baking.

When the fist microstructured object serving as the drive portion is formed by these steps, resin, or dissolved glass or metal is applied onto this first microstructured object. Then, the second microstructured object is formed by mold transfer. At the time of the mold transfer of the second microstructured object, resin, glass, and gas contained in metallic material can be removed to the outside by reducing the ambient pressure to a value that is lower than a usual value, as described above. Furthermore, the accuracy of the second microstructured portion to be formed by the mold transfer can be enhanced by including such a process. To cure the second microstructured object by the mold transfer, for instance, cooling, ultraviolet-setting, and thermosetting are effective. Especially, when a material capable of transmitting light is used as the material of the mold, visual alignment can be easily achieved. Additionally, the resin can be cured by being irradiated with light, such as ultraviolet.

After the second microstructured object and the third microstructured object are manufactured by using the same mold and performing the transfer, the sacrifice layer for fixing the first microstructured object, which is manufactured by using the photolithography step and the etching step, is eliminated. Finally, the mask film formed at the photolithography step is removed. Thus, the micromachine is completed. In the foregoing description, it has been described that the first microstructured object formed at the silicon process and the surroundings thereof are fixed when the second microstructured object is formed by the transfer. Even when the first microstructured object is formed by using other techniques, for instance, machining, it is preferable that after the first microstructured object is fixed by the sacrifice layer, such as resin, aluminum, and $SiO_2$, the second or third microstructured object is formed by the mold transfer.

Experiments conducted by the inventors of the present invention have verified that, similarly as the case of the aforementioned spatial light modulator, when the second microstructured object is formed by the mold transfer, it is effective to fix the movable first microstructured object by the sacrifice layer, which can be removed later, so as to prevent the movable first microstructured object from being destroyed by stress occurring when the second microstructured object is formed by the mold transfer.

Further, at the time of the mold transfer, the transfer of the second and third microstructured objects is performed by using the same mold. Consequently, the positional relationship among the first, second, and third microstructured objects can be easily and accurately controlled. Furthermore, the mold can be used a plurality of times. Thus, as compared with the case of manufacturing the second and third microstructured objects by performing machine-cutting and the silicon process, the microstructured objects of more complex shapes can be manufactured at low cost.

Furthermore, the transfer mold is produced by a method of machining a glass material, a metallic material, and a resin, which transmit light, a method of performing optical molding, or a method, in which the shape of a primary mold is first formed by performing isotropic etching and anisotropic etching on the silicon substrate in the silicon process, and then a secondary mold is produced from this primary mold, and moreover, the transfer of the second microstructured object is performed, thereby obtaining the inverse of the shape obtained by anisotropic etching of the silicon substrate.

In the case that the manufacturing method includes the step of removing the unnecessary part formed around the second microstructured object at the time of transfer thereof, when an object, such as a gear, of a shape having a high aspect ratio is placed near to the second microstructured object, it is difficult to form a plurality of second microstructured objects by the mold transfer. In this case, it is effective to form a plurality of second microstructured objects by performing the photolithography step and etching after an object of a shape for forming each second microstructured object is preliminarily provided by the mold transfer in a range in which a plurality of second microstructured portions are disposed.

Example of Manufacture of Fluid Valve

Next, a fluid valve is described hereinbelow as a further example of the micromachine of the present invention. A fluid valve has an orifice that is a hole connecting spaces partitioned by a partition plate for partitioning a space. The distance between the orifice and a valve is automatically controlled according to temperature by combining this orifice with the value provided on an actuator having a function of moving according to the ambient temperature. Thus, the movement of a fluid can be voluntarily limited.

FIGS. 2(a)–(b) show an outline of the configuration of a fluid valve 62 employing a micromachine having a structure according to the present invention. This fluid valve 62 has a bimetal actuator 65 serving as the first microstructured portion, and a valve element 63, which is provided at the leading end of this actuator 65 and serves as the second microstructured portion. The valve element 63 is supported by the bimetal actuator 65 at a place at which the valve element 63 is inserted into the orifice 64, which is formed in a partition plate 61. The bimetal actuator 65 and the partition plate 61 are supported by a base 60 for fixing the actuator 65 and the plate 61 through the post 2.

The bimetal actuator 65 is a drive portion for this micromachine, and serves as the first microstructured portion, and has a structure in which two kinds of metallic films, which differ in expansion coefficient from each other, are stacked. Similarly as in the aforesaid case, the microstructured bimetal actuator can be easily manufactured by the photolithography technique.

The valve element 63 placed at and overlaid on the leading end of the bimetal actuator 65 is formed from a resin, such as rubber, whose hardness is not so high, as compared with that of glass silicon, and the like, by using a transfer mold. As a result of employing a resin whose hardness is not so high, the adhesiveness between the orifice 64 and the valve element 63 is enhanced. A first space 67 and a second space 68 to be partitioned from each other by the partition plate 61 are efficiently and reliably shut off from each other. The material of the bimetal actuator 65 is metal, so that the adhesiveness may be low when the valve element 63 is formed from a resin. Thus, it is preferable that a layer made of a non-metallic material, such as silicon and glass, is provided on (the surface of) the bimetal actuator 65 serving as the first microstructured object, and that the valve element 63 is formed as the second microstructured portion by the mold transfer so that the layer made of the non-metallic material is sandwiched between the valve element 63 and the bimetal actuator 65.

Further, in the case that the valve element 63 is of the needle type, such a valve element has an advantage in that the aperture ratio of the fluid valve can be linearly controlled. The mold transfer can easily reproduce minute and complex shapes. Thus, in the case that the valve element 63 is manufactured by the mold transfer, a minute shape needle of the micron order size, or a more smaller needle can be easily manufactured with high accuracy. Furthermore, highly reliable mass products can be provided by the combination of the photolithography techniques and the mold transfer. Consequently, products each having these microvalves arranged in a one-dimensional or two-dimensional array can be provided in high yield.

Figure 12:
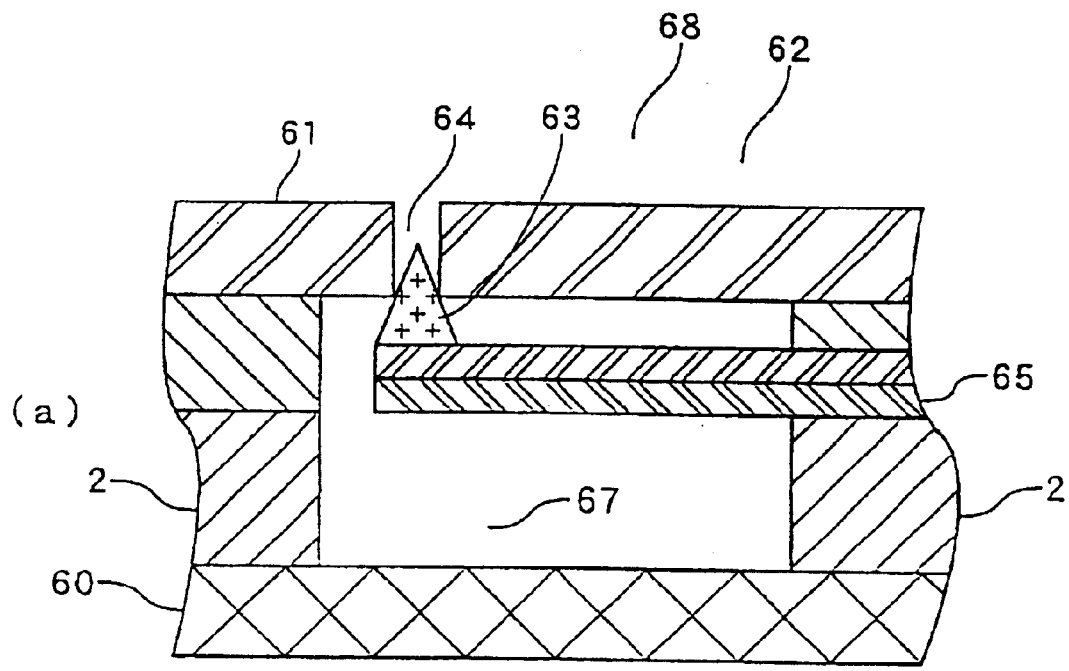
FIGS. 12(a)–(b) are diagrams illustrating the configuration and operation of a fluid valve according to the present invention.
Figure 12:
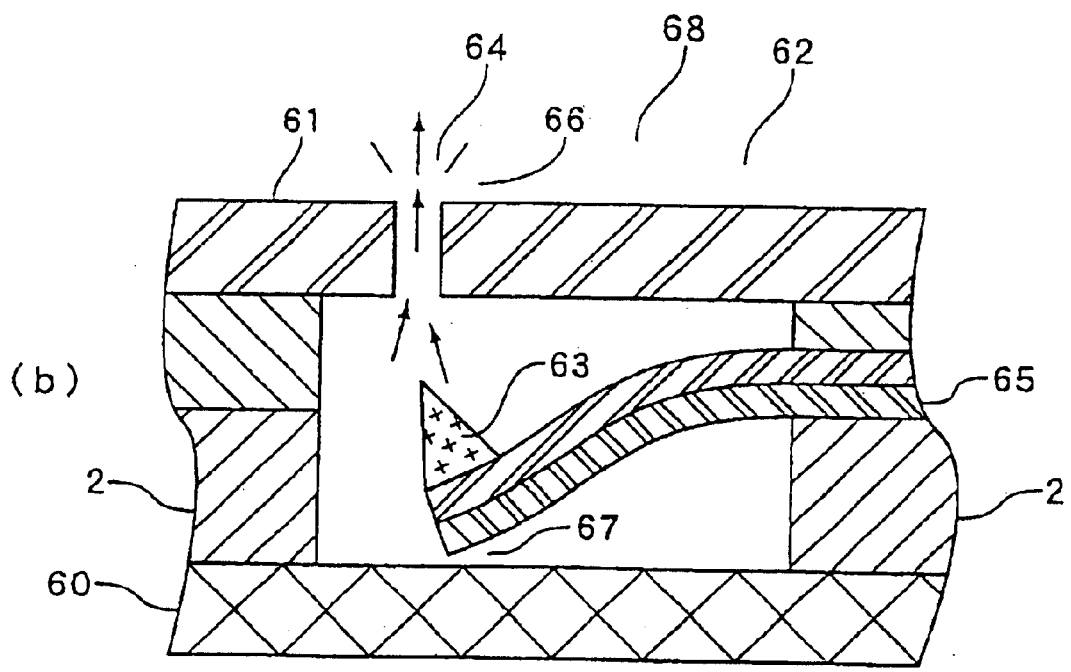

FIG. 12(a) illustrates a state in which the fluid valve 62 is closed at low ambient temperature. The bimetal actuator 65 is set in such a manner as to be maintained in a nearly planar condition at low temperature. The valve element 63 provided on this bimetal actuator by the mold transfer is restrained at the position of the orifice 64 in a state in which the orifice 64 is closed. Consequently, the first space 67 at the side of the base 60 is separated from the second space 68 above the partition plate 61, so that no fluid can move through the orifice 64.

FIG. 12(b) illustrates a state in which the fluid valve 62 is opened at high ambient temperature. As the temperature rises, the bimetal actuator 65 having an end fixed through the post 2 onto the base 60 gradually warps to the side of the base 60 owing to the difference in expansion coefficient of two kinds of metals of the actuator 65. The valve element 63 is linked with the bimetal actuator 65 and moves in such a manner as to gradually widen the distance to the orifice 64 therefrom. As shown in this figure, when the valve element 63 having been disposed in such a way as to close the orifice 64 is detached from the orifice 64, the first space 67 and the second space 68, which have been partitioned from each other by the partition plate 61, are spatially connected with each other through the orifice 64. As a result, in the case where that the inner pressure of the first space 67 is higher than that of the second space 68, a fluid flows from the first space 67 into the second space 68 through the orifice 6. As described above, the valve element 63 of this example is formed into a needle shape. Thus, the aperture ratio of the fluid valve 62 can be linearly controlled. Consequently, the flow rate of a fluid flowing through the fluid valve 62 gradually varies with the ambient temperature.

Although such a valve element 62 can be manufactured by optical molding, the mold transfer is more suitable for mass production of micromachines of stable quality. Further, as described above, the actuator serving as the first microstructured portion can be manufactured by using a method using techniques other than the photolithography techniques As described above, the micromachine and the manufacturing method thereof according to the present invention are suitable for a micromachine that may consist of dynamic first microstructured portion serving as a drive portion, and a static second microstructured portion for performing a switching function or a function to be performed as an optical element. This micromachine can be manufactured at least without a complex process, such as a silicon process by forming a static second microstructured object on or in such a manner as to be overlaid on a dynamic microstructured object by mold transfer. Further, a micromachine of a complex shape can be formed with good reproducibility. Moreover, the present invention can contribute to the improved productivity of the micromachine.

Especially, when a plurality of elements are arranged in an array, similarly as in a spatial light modulator, the mold transfer can stably reproduce elements, as compared with the case of manufacturing the entire micromachine by performing the silicon process. The probability of an occurrence of a defect becomes extremely low. Furthermore, the present invention considerably contributes to increased yield. The second microstructured object can be formed in a state, in which the first microstructured object is fixed by a sacrifice layer, by providing the sacrifice layer around the moving first microstructured object and by forming the second microstructured object by mold transfer before the step of etching the sacrifice layer. Therefore, the positioning accuracy of the second microstructured object to be formed in such a way as to be overlaid on the first microstructured object. Further, the first microstructured object can be prevented from being destroyed by stress at the time of performing the mold transfer. Consequently, micromachines of more stable quality can be manufactured and provided.

Furthermore, the second structured object, which is provided on the first microstructured object, and another microstructured object, that is, a third microstructured object, which is not provided on the first microstructured object, can be formed by performing the mold transfer and using the same mold. Further, an occurrence of a deviation in position between the second and third microstructured objects by manufacturing these microstructured object by use of the same mold. Consequently, the precision positioning thereof can be achieved. Therefore, the present invention is very effective in the case that there is the necessity for fabricating a micromachine by combining a plurality of microstructured objects with one another.

Further, the mold to be used at the time of performing the mold transfer can be made of a material that transmits light. In the case of employing an optically transmissive mold, the positioning of the mold is facilitated. Furthermore, the positioning thereof by using a CCD camera can be achieved. Thus, the productivity of micromachines is increased still more. Furthermore, in the case that an ultraviolet-set resin is used as the material to be used for the mold transfer, such a material can be cured through a mold by employing an optically transmissive mold. As compared with the mold transfer utilizing dissolution, the mold transfer using an ultraviolet-set resin is easy to handle, and can take enough time to perform alignment. Consequently, stable production of micromachines is realized.

Furthermore, the second microstructured object can be realized by forming a mold from a material, such as a resin and rubber, whose hardness is low in comparison with those of glass and metal. The employment of a second microstructured object formed by the mold transfer using a mold made of such a material has an advantage in that when such a second microstructured object is used by being in contact with another microstructured object, the adhesiveness therebetween is increased.

INDUSTRIAL APPLICABILITY

Micromachines according to the present invention are suitable for optical switching elements and spatial light modulators. Thus, optical communication devices, optical computing devices, optical storage devices, optical printers, and image display devices can be manufactured by using such micromachines. Moreover, the present invention can provide micromachines useful for fluid control devices, temperature sensing devices, and micropumps.

What is claimed is:

1. A micromachine comprising:
    a first microstructured portion; and
    a second microstructured portion of a predetermined shape, at least a part of which is formed by mold transfer, the first microstructured portion connected to the second microstructured portion for driving the second microstructured portion to cause substantially all reflected incident light from a light source to travel in a direction almost perpendicular to an area between the first and second microstructured portions.

2. The micromachine according to claim 1, said second microstructured portion having a switching function.

3. The micromachine according to claim 1, said second microstructured portion performing as an optical switching element.

4. The micromachine according to claim 1, said first microstructured portion and said second microstructured portion being arranged in an array.

5. The micromachine according to claim 1, further comprising:
    a third microstructured portion of a predetermined shape not driven by said first microstructured portion, at least a part of said third microstructured portion which relates to said second microstructured portion being formed by mold transfer.

6. The micromachine according to claim 5, one of a predetermined gap and a predetermined step being provided between said second microstructured portion and said third microstructured portion.

7. The micromachine according to claim 1, said first microstructured portion being formed by photolithography techniques.

8. The micromachine according to claim 1, said second microstructured portion comprising a resin.

9. The micromachine according to claim 8, said second microstructured portion comprising a photosetting resin.

10. The micromachine according to claim 8, a boundary surface between said first microstructured portion and said second microstructured portion comprising a non-metallic material.

11. A micromachine manufacturing method for manufacturing a micromachine, in which a first microstructured portion is operative to drive a second microstructured portion of a predetermined shape, the method comprising:
    a first microstructured portion providing step of providing a first microstructured portion; and
    a molding step of forming at least a part of said second microstructured portion on said first microstructured portion by mold transfer, after said first microstructured portion is provided so that substantially all reflected incident light from a light source travels in a direction almost perpendicular to an area between the first and second microstructured portions.

12. The micromachine manufacturing method according to claim 11, said second microstructured portion having a switching function.

13. The micromachine manufacturing method according to claim 11, said second microstructured portion performing as an optical switching element.

14. The micromachine manufacturing method according to claim 11, further comprising a plurality of first microstructured portions and a plurality of second microstructured portions arranged in an array, a part of each of the plurality of second microstructured portions arranged in the array being transferred using a same mold used in said molding step.

15. The micromachine manufacturing method according to claim 11, said micromachine comprising a third microstructured portion not driven by said first microstructured portion, at least a part of said third microstructured portion which relates to said second microstructured portion being transferred using a same mold used in said molding step.

16. The micromachine manufacturing method according to claim 15, one of a predetermined gap and a predetermined step being formed between said second microstructured portion and said third microstructured portion in said molding step.

17. The micromachine manufacturing method according to claim 11, further comprising:
a photolithography step performed before said molding step, said first microstructured portion being formed by photolithography techniques in said photolithography step.

18. The micromachine manufacturing method according to claim 17, further comprising:
an etching step of etching a sacrifice layer after said molding step, said sacrifice layer, which is provided around said first microstructured portion, not being etched at said photolithography step.

19. The micromachine manufacturing method according to claim 17, no metallic film being formed on a boundary surface, on which said second microstructured portion is stacked, in said photolithography step.

20. The micromachine manufacturing method according to claim 11, further comprising:
a sacrifice layer providing step of providing a sacrifice layer around said first microstructured portion before said molding step.

21. The micromachine manufacturing method according to claim 11, further comprising:
a planarizing step of planarizing said first microstructured portion and surroundings thereof during or following said molding step.

22. The micromachine manufacturing method according to claim 11, a mold used in said molding step being formed on a silicon substrate by a combination of anisotropic etching and isotropic etching in such a manner so as to have a predetermined shape.

23. The micromachine manufacturing method according to claim 11, a mold used in said molding step being adapted to transmit light.

24. The micromachine manufacturing method according to claim 11, a mold used in said molding step being a secondary mold obtained by reverse-forming of a first mold.

25. The micromachine manufacturing method according to claim 11, said molding step comprising a pressure reducing step of reducing ambient pressure in a state, in which a mold is used, in such a way as to be lower than atmospheric pressure.

26. The micromachine manufacturing method according to claim 11, said molding step comprising a pressure reducing step of reducing ambient pressure in a state, in which a mold is used, in such a way as to realize an almost vacuum condition.

27. The micromachine manufacturing method according to claim 11, said molding step comprising a second microstructured forming step of forming said second microstructured portion by removing a part of said second microstructured after being molded by mold transfer.

* * * * *